United States Patent
Jang

(10) Patent No.: US 12,355,269 B2
(45) Date of Patent: Jul. 8, 2025

(54) MAGNETIC FIELD SHIELDING SHEET AND MANUFACTURING METHOD THEREOF

(71) Applicant: AMOSENSE CO., LTD., Cheonan-si (KR)

(72) Inventor: Kil Jae Jang, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 225 days.

(21) Appl. No.: 17/620,285

(22) PCT Filed: Jun. 17, 2020

(86) PCT No.: PCT/KR2020/007848
§ 371 (c)(1),
(2) Date: Dec. 17, 2021

(87) PCT Pub. No.: WO2020/256409
PCT Pub. Date: Dec. 24, 2020

(65) Prior Publication Data
US 2022/0368169 A1    Nov. 17, 2022

(30) Foreign Application Priority Data

Jun. 18, 2019  (KR) .................. 10-2019-0072105
Jun. 18, 2019  (KR) .................. 10-2019-0072106
Jun. 17, 2020  (KR) .................. 10-2020-0073631

(51) Int. Cl.
*H05K 9/00*   (2006.01)
*H01F 27/36*  (2006.01)
(Continued)

(52) U.S. Cl.
CPC .............. *H02J 50/70* (2016.02); *H01F 27/36* (2013.01); *H01F 41/0206* (2013.01);
(Continued)

(58) Field of Classification Search
CPC  H02J 50/70; H02J 50/20; H01F 27/36; H01F 41/0206; H01Q 1/526; H04B 5/79; H05K 9/0075
See application file for complete search history.

(56) References Cited

U.S. PATENT DOCUMENTS 6,972,097 B2 * 12/2005  Yoshida ............... H05K 9/0083
257/E23.114
7,445,852 B2 * 11/2008  Maruko .............. H01F 1/15358
428/692.1
(Continued)

FOREIGN PATENT DOCUMENTS

KR   20160144042 A   12/2016
KR   20170051570 A    5/2017
(Continued)

OTHER PUBLICATIONS

Office Action issued in JP Application No. 2021-575510 dated Dec. 20, 2022 (10 pages).
(Continued)

*Primary Examiner* — Ryan J. Walters
(74) *Attorney, Agent, or Firm* — ROTHWELL, FIGG, ERNST & MANBECK, P.C.

(57) ABSTRACT

Provided is a magnetic field shielding sheet. A magnetic field shielding sheet according to an exemplary embodiment of the present invention is a magnetic field shielding sheet for an antenna, which includes a hollow portion having a predetermined area in a central portion thereof and a pattern portion configured to surround the hollow portion, includes a sheet body formed as a ribbon sheet including at least one selected from an amorphous alloy and a nanocrystalline alloy, a plurality of through-portions formed in a region of the sheet body corresponding to the pattern portion, and a plurality of cracks formed to extend from the through-portions.

6 Claims, 18 Drawing Sheets

(51) Int. Cl.
*H01F 41/02* (2006.01)
*H01Q 1/52* (2006.01)
*H02J 50/20* (2016.01)
*H02J 50/70* (2016.01)
*H04B 5/79* (2024.01)

(52) U.S. Cl.
CPC ............ *H01Q 1/526* (2013.01); *H02J 50/20* (2016.02); *H04B 5/79* (2024.01); *H05K 9/0075* (2013.01)

(56) References Cited

U.S. PATENT DOCUMENTS

| | | | |
|---|---|---|---|
| 9,252,611 B2* | 2/2016 | Lee | H05K 9/0081 |
| 9,391,363 B2* | 7/2016 | Choi | H01Q 1/38 |
| 9,813,114 B2* | 11/2017 | Oh | H04B 5/0031 |
| 10,028,420 B2* | 7/2018 | Cho | H05K 9/0075 |
| 10,931,152 B2* | 2/2021 | Hwang | H05K 9/0075 |
| 11,006,553 B2* | 5/2021 | Lee | B32B 37/18 |
| 11,594,356 B2* | 2/2023 | Jang | H01F 41/0266 |
| 2004/0108486 A1* | 6/2004 | Yoshida | H05K 1/0233 |
| | | | 257/E23.114 |
| 2005/0089708 A1* | 4/2005 | Maruko | C22C 45/02 |
| | | | 428/655 |
| 2008/0068280 A1 | 3/2008 | Koenig et al. | |
| 2012/0057322 A1 | 3/2012 | Waffenschmidt | |
| 2014/0176380 A1* | 6/2014 | Choi | H01Q 1/38 |
| | | | 156/60 |
| 2016/0345471 A1* | 11/2016 | Cho | H01F 27/36 |
| 2018/0168057 A1 | 6/2018 | Peralta et al. | |
| 2019/0044391 A1* | 2/2019 | Jang | H04B 5/0081 |
| 2019/0148988 A1* | 5/2019 | Hwang | H02J 50/70 |
| | | | 307/104 |

FOREIGN PATENT DOCUMENTS

| | | |
|---|---|---|
| KR | 20170093029 A | 8/2017 |
| KR | 20180102528 A | 9/2018 |
| KR | 20120029433 A | 3/2021 |

OTHER PUBLICATIONS

International Search Report issued in PCT/KR2020/007848 dated Sep. 28, 2020, 3 pages.
Extended European Search Report issued in EP20827587.5 dated Jun. 15, 2023, 10 pgs.

* cited by examiner

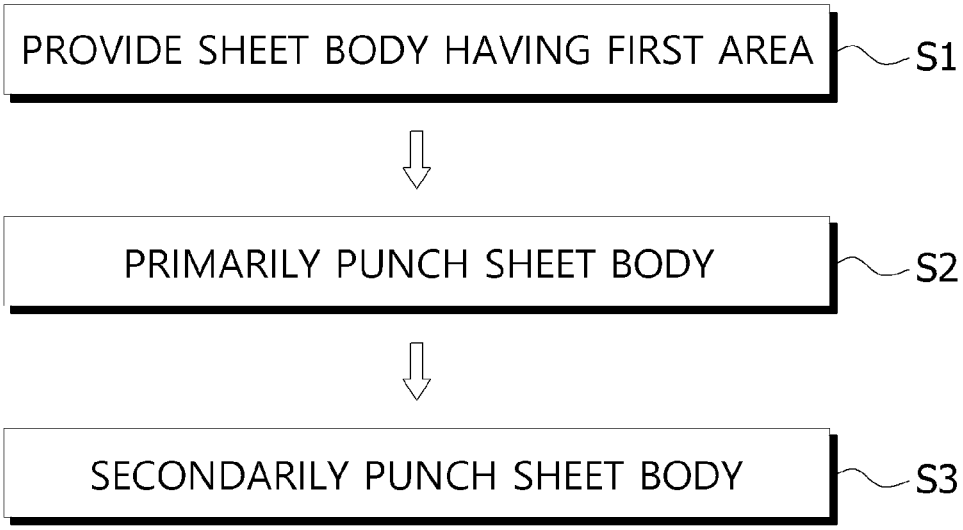
FIG. 12
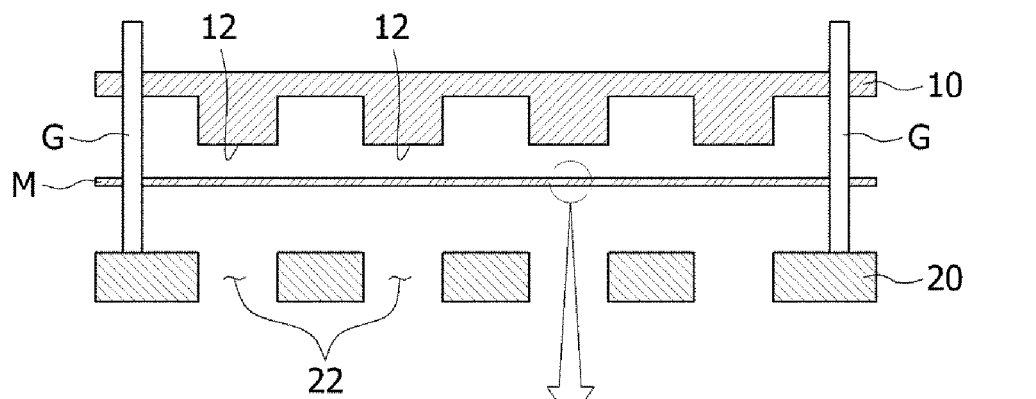
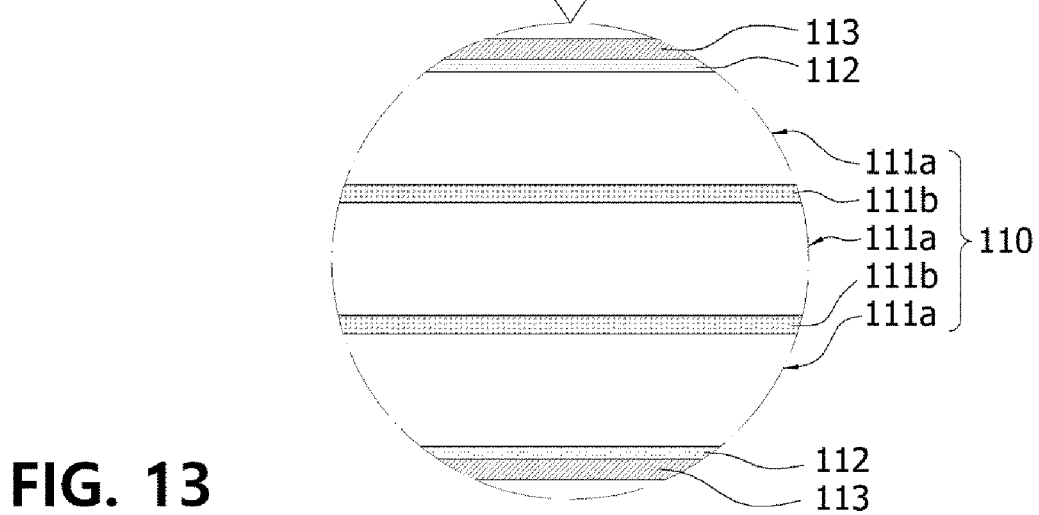
FIG. 13

MAGNETIC FIELD SHIELDING SHEET AND MANUFACTURING METHOD THEREOF

CROSS REFERENCE TO RELATED APPLICATIONS

This application is the national phase entry of International Application No. PCT/KR2020/007848, filed on Jun. 17, 2020, designating the United States, which is based upon and claims priority to Korean Patent Applications 10-2019-0072105, filed on Jun. 18, 2019, 10-2019-0072106, filed on Jun. 18, 2019, and 10-2020-0073631, filed on Jun. 17, 2020, the entire contents of which are incorporated herein by reference.

TECHNICAL FIELD

The present invention relates to a magnetic field shielding sheet and a manufacturing method thereof.

BACKGROUND

Near field communication (NFC) methods and wireless charging methods are essentially non-contact transmission methods. Such a non-contact transmission method is implemented through an antenna for transmitting or receiving a magnetic field and a magnetic field shielding sheet disposed on one surface of the antenna to smoothly transmit or receive a magnetic field.

In general, a sheet made of a magnetic material, such as an amorphous ribbon sheet, a ferrite sheet, or a polymer sheet, is used as a magnetic field shielding sheet.

Meanwhile, as a magnetic field shielding sheet, a sheet in a form, which is formed by being separated into a plurality of pieces to greatly reduce the loss due to an eddy current or improve the flexibility of a sheet itself, is used.

For example, the magnetic field shielding sheet may be formed by being separated into a plurality of pieces through a flake process. Such a flake process may be performed using a metal roller, in which a plurality of concavo-convex portions or spherical balls are formed on an outer surface thereof, and a rubber roller.

That is, when a magnetic field shielding sheet passes through between the metal roller and the rubber roller a plurality of times in a state in which the metal roller and the rubber roller are disposed to face each other, the magnetic field shielding sheet may be formed by being separated into a plurality of pieces.

Accordingly, in order to manufacture the magnetic field shielding sheet formed by being separated into the plurality of pieces, since a separate flake process for separating the sheet itself into the plurality of pieces is required, there is a problem of increasing production costs.

Meanwhile, in the flake process performed through one pair of rollers, since the magnetic field shielding sheet passes between one pair of rollers, the total area of the sheet is pressed through one pair of rollers. Accordingly, in the magnetic field shielding sheet manufactured trough the flake process, the entire sheet is inevitably formed by being separated into a plurality of pieces.

In addition, a magnetic field shielding sheet formed by being separated into a plurality of pieces through the conventional flake process may have uniform characteristics only when the flake process should be performed a plurality of times.

However, as the flake process is repeatedly performed, the size of pieces separated from each other becomes smaller, but the total number of the pieces separated from each other is increased. Accordingly, since a resistance of the shielding sheet itself is increased as the flake process is repeatedly performed, the influence due to an eddy current can be reduced, but there is a problem in that the magnetic permeability of the shielding sheet is decreased to 1,500 or less.

Therefore, when a magnetic field shielding sheet is to be implemented to have a high magnetic permeability of 2,000 or more while having an increased self-resistance, there is a problem in that the overall thickness of the magnetic field shielding sheet should be increased.

SUMMARY OF THE INVENTION

The present invention is directed to providing a magnetic field shielding sheet capable of implementing a high magnetic permeability of 2,000 or more while having a very thin thickness by locally forming through-portions and cracks induced therefrom only in a partial region of a total area, and a manufacturing method thereof.

The present invention is also directed to providing a manufacturing method of a magnetic field shielding sheet, which is capable of selectively forming cracks in a region corresponding of a total area to an antenna even without performing a separate flake process.

One aspect the present invention provides a magnetic field shielding sheet for an antenna, which includes a hollow portion having a predetermined area in a central portion thereof and a pattern portion configured to surround the hollow portion, including a sheet body formed as a ribbon sheet including at least one selected from an amorphous alloy and a nanocrystalline alloy, a plurality of through-portions formed in a region of the sheet body corresponding to the pattern portion, and a plurality of cracks formed to extend from the through-portions.

The through-portion may have a length greater than a width.

The plurality of through-portions may be disposed to be spaced apart from each other at intervals.

The through-portion may include a first portion formed in the region corresponding to the pattern portion, and a second portion extending from the first portion to a region corresponding to the hollow portion of the antenna. In this case, the plurality of through-portions may be connected to each other through the second portion.

The plurality of through-portions may be formed such that the second portions thereof are connected to each other at a center point of the hollow portion of the antenna.

The sheet body may be a multi-layered sheet in which a plurality of ribbon sheets identical to the ribbon sheet are stacked in at least two layers, and the sheet body may include a protective film attached to at least one surface of an upper surface and a lower surface thereof through an adhesive layer.

The magnetic field shielding sheet may have a total thickness of 55 µm to 85 µm.

The plurality of through-portions may include at least one type of a first through-portion formed in a direction perpendicular to a width direction or a length direction of the sheet body, a second through-portion formed in a direction parallel to the width direction or the length direction of the sheet body, a third through-portion formed to be inclined at a predetermined angle with respect to the width direction or the length direction of the sheet body, and a fourth through-portion formed in an arc shape having a predetermined curvature.

Another aspect of the present invention provides a magnetic field shielding sheet for an antenna, which includes a hollow portion having a predetermined area in a central portion thereof and a pattern portion configured to surround the hollow portion, including a sheet body formed as a multi-layered sheet in which a ribbon sheet including at least one selected from an amorphous alloy and a nanocrystalline alloy is stacked in two or three layers through an adhesive layer, a plurality of through-portions which are formed to pass through an arrangement region of the sheet body corresponding to the pattern portion and are formed in a linear shape having a length greater than a width, and a plurality of cracks formed to extend from the through-portions to the sheet body, wherein each of the plurality of through-portions is formed in the linear shape having a width of 0.1 mm to 0.4 mm, a total number of the plurality of through-portions is 4 to 16, and the plurality of through-portions are formed to not be connected to each other.

Still another aspect of the present invention provides a magnetic field shielding sheet for an antenna, which includes a hollow portion having a predetermined area in a central portion thereof and a pattern portion configured to surround the hollow portion, including a sheet body formed as a ribbon sheet including at least one selected from an amorphous alloy and a nanocrystalline alloy, a plurality of through-portions formed in a corresponding region of the sheet body corresponding to the hollow portion of the antenna, and a plurality of cracks formed to extend from the through-portions.

The plurality of through-portions may be disposed to surround a center point of the corresponding region, and a partial region, which includes the center point of the corresponding region, of the corresponding region, may be formed by being separated into a plurality of pieces through the plurality of cracks extending from the plurality of through portions.

Yet another aspect of the present invention provides a wireless power receiving module including a wireless power reception antenna which includes a hollow portion having a predetermined area in a central portion thereof and a pattern portion configured to surround the hollow portion, and the above-described magnetic field shielding sheet which is disposed on one surface of the wireless power reception antenna.

The above-described wireless power receiving module may be applied to a portable terminal device.

According to yet another embodiment of the present invention, a manufacturing method of a magnetic field shielding sheet for an antenna, which includes a hollow portion having a predetermined area in a central portion thereof and a pattern portion configured to surround the hollow portion, includes providing a sheet body having a first area formed as a ribbon sheet including at least one selected from an amorphous alloy and a nanocrystalline alloy which are treated with heat, primarily punching the sheet body to form through-portions having a predetermined width and length in an inner region of the sheet body and form a plurality of cracks extending from the through-portions, and secondarily punching the sheet body to form a shielding sheet which includes the through-portions and has a second area that is relatively less than the first area.

The through-portions may be formed to pass through an arrangement region in which the pattern portion of the antenna is disposed.

The through-portions may be formed to pass through a corresponding region corresponding to the hollow portion of the antenna.

The primary punching of the sheet body may be performed using a mold which includes an edge blade having a rig shape configured to form an edge of the through-portion and a separation member formed in an inner region of the edge blade and configured to press a cut-out piece cut from the sheet body through the edge blade to separate the cut-out piece.

The secondary punching of the sheet body may be forming an outer edge defining the second area in the sheet body such that the shielding sheet is separable from the sheet body.

The providing of the sheet body may include forming a multi-layered sheet in which a plurality of ribbon sheets identical to the ribbon sheet are stacked in a multi-layer through a first adhesive layer, and attaching a protective film to a lower surface of the multi-layered sheet through a second adhesive layer in which an adhesive is applied on both surfaces of a substrate, and the outer edge may be formed to pass through the multi-layered sheet and the second adhesive layer.

According to the present invention, it is possible to implement a magnetic field shielding sheet having a high magnetic permeability of 2,000 or more while having a very thin thickness.

In addition, according to the present invention, even without performing a separate flake process, cracks can be selectively formed in an area of a total area corresponding to an antenna or in a partial region thereof in which a magnetic flux is concentrated. Therefore, it is possible to easily manufacture a shielding sheet that satisfies design conditions and required specifications.

BRIEF DESCRIPTION OF THE DRAWINGS

FIG. 12 is a flowchart illustrating a manufacturing method of a magnetic field shielding sheet according to one embodiment of the present invention.

FIG. 13 shows views conceptually illustrating one type of a mold usable in a primary punching operation in the manufacturing method of a magnetic field shielding sheet according to one embodiment of the present invention.

FIGS. 14A and 14B are plan views illustrating a mold applicable in FIG. 13, wherein FIG. 14A is a plan view of an upper mold for primary punching, and FIG. 14B is a plan view of a lower mold for primary punching.

FIGS. 15A and 15B are plan views illustrating another type of a mold applicable in FIG. 13, wherein FIG. 15A is a plan view of an upper mold for primary punching, and FIG. 15B is a plan view of a lower mold for primary punching.

DETAILED DESCRIPTION

Figure 1:
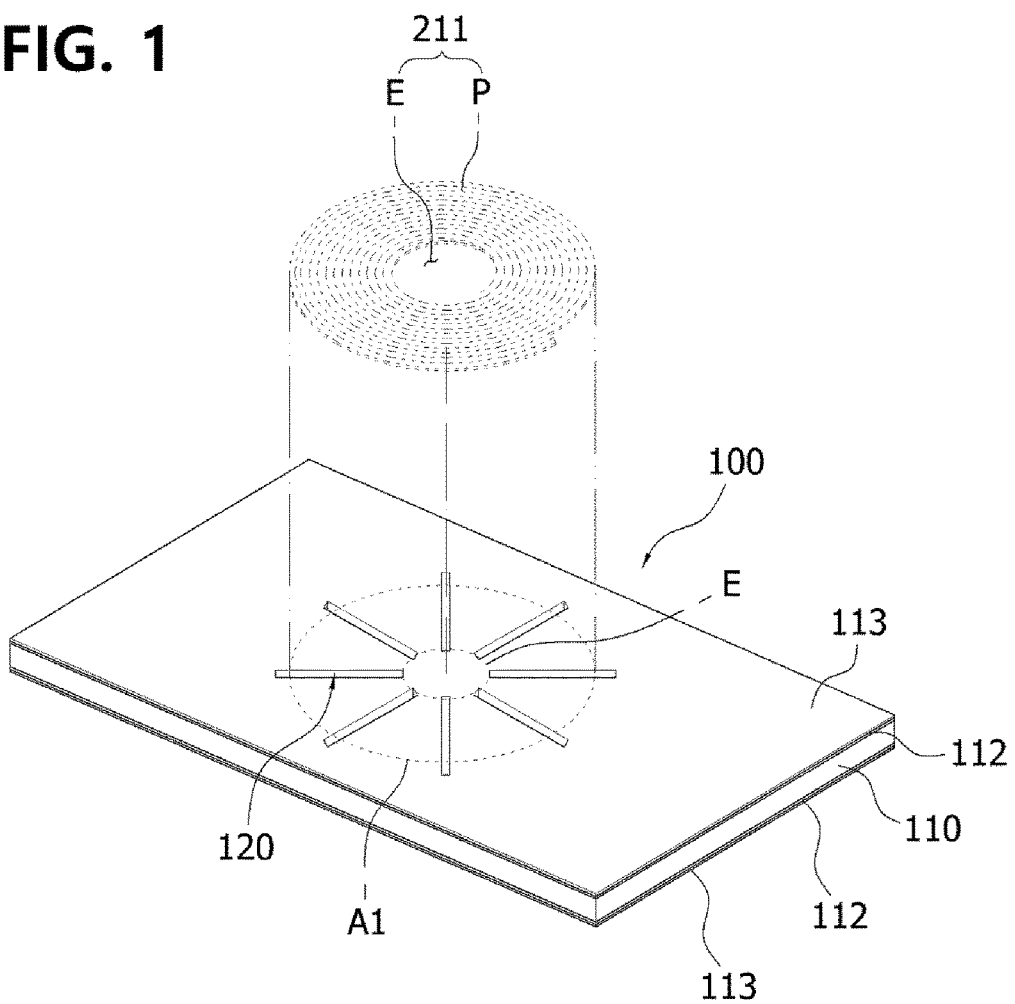
FIG. 1 shows views illustrating a magnetic field shielding sheet according to one embodiment of the present invention.

Hereinafter, embodiments of the present invention will be described in detail with reference to the accompanying drawings so as to be easily practiced by a person of ordinary skill in the art to which the present invention pertains. It should be understood that the present invention may be embodied in various different forms and is not limited to the following embodiments. Parts irrelevant to description are omitted in the drawings in order to clearly describe the present invention, and like reference numerals refer to like elements throughout the specification.

Figure 5:
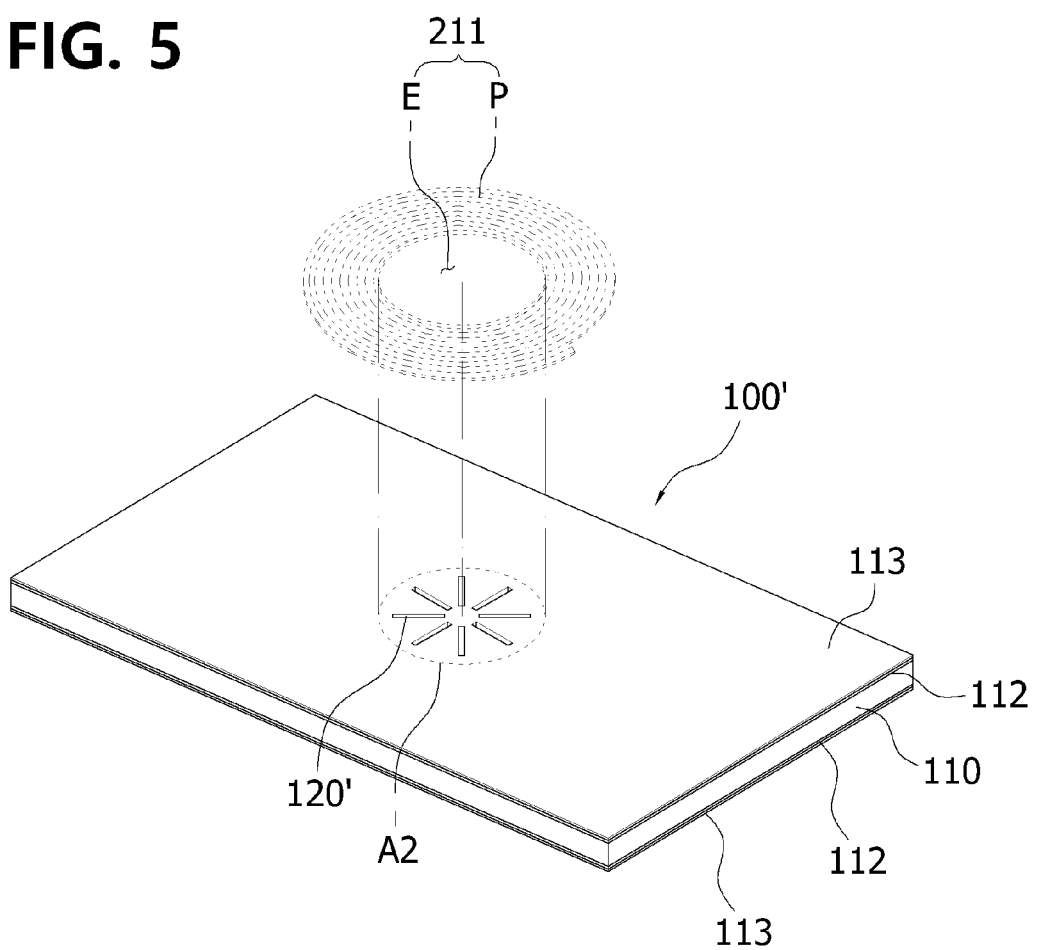
FIG. 5 shows views illustrating a magnetic field shielding sheet according to another embodiment of the present invention.

As shown in FIGS. 1 and 5, a magnetic field shielding sheet 100 or 100' according to one embodiment of the present invention includes a sheet body 110, through-portions 120 or 120', and cracks 130.

The sheet body 110 may be made of a magnetic material so as to shield a magnetic field generated from an antenna 211 or 212.

Here, the antenna 211 or 212 may include a hollow portion E having a predetermined area in a central portion thereof and a pattern portion P formed to surround the hollow portion E with a predetermined number of turns.

In this case, the antenna 211 or 212 may be an antenna pattern in which the pattern portion P is patterned and formed such that the hollow portion E having a predetermined area is formed in at least one surface of a circuit board 210 (see FIGS. 10 and 11) or may be a flat coil in which a conductive member having a predetermined wire diameter is wound a plurality of times to form the pattern portion P such that the hollow portion E having a predetermined area is formed in a central portion thereof.

In addition, the antenna 211 or 212 may be a wireless power transfer antenna 211 for transmitting or receiving wireless power, a magnetic secure transmission (MST) antenna for magnetic payment, or a near field communication (NFC) antenna 212 for near field communication.

In addition, the antenna 211 or 212 may be provided as a combo type including two or more of the wireless power transfer antenna 212, the MST antenna, and the NFC antenna 212.

In this case, the sheet body 110 may be made of a material including a metal component such that the cracks 130 may be formed from the through-portions 120 or 120' together with the through-portions 120 or 120'.

Figure 9:
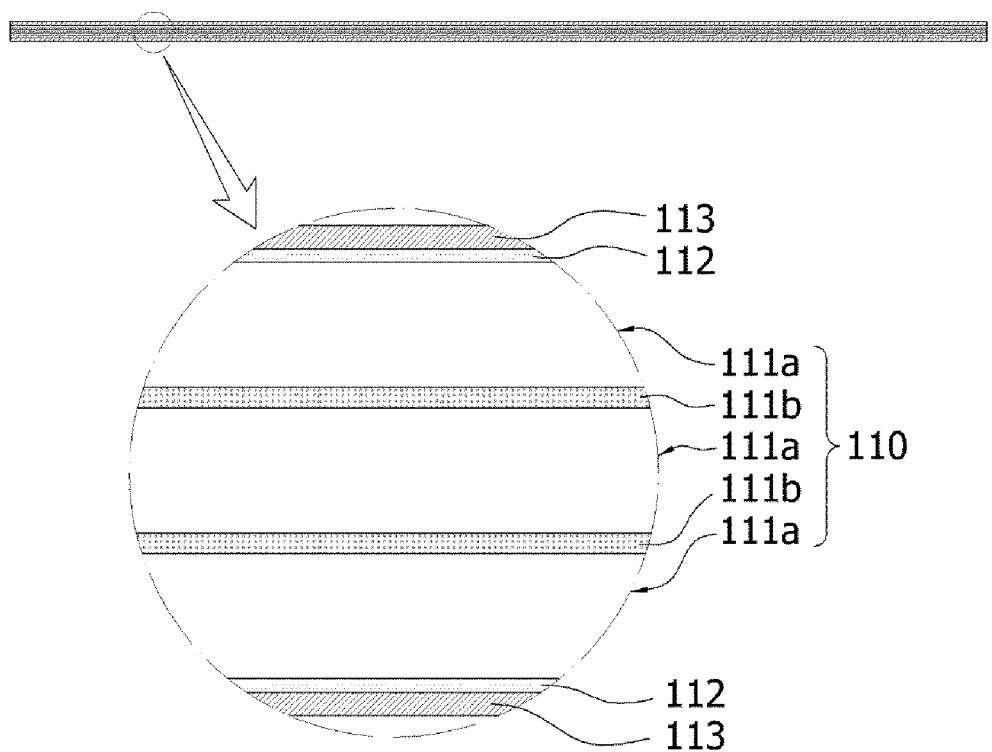
FIG. 9 shows cross-sectional views illustrating a detailed configuration of a magnetic field shielding sheet according to the present invention.

As an example, as shown in FIG. 9, the sheet body 110 may be a ribbon sheet 111a including at least one selected from an amorphous alloy and a nanocrystalline alloy.

Such a sheet body 110 may be formed as a single-layered ribbon sheet 111a. However, the sheet body 100 may be a multi-layered sheet in which a plurality of ribbon sheets 111a are stacked in a multi-layer trough a first adhesive layer 111b. In this case, the multi-layered sheet may be a multi-layered sheet in which the plurality of ribbon sheets 111a are stacked in two or three layers. However, a total number of stacked layers of the multi-layered sheet is not limited thereto and may be appropriately changed according to design conditions.

In addition, the sheet body 110 may be a hybrid sheet in which a ribbon sheet made of an amorphous alloy and a ribbon sheet made of a nanocrystalline alloy are combined.

In this case, a protective film 113 may be attached to at least one surface of an upper surface and a lower surface of the sheet body 110 through a second adhesive layer 112.

Accordingly, even when the sheet body 110 includes the cracks 130 extending from the through-portion 120 or 120', the sheet body 110 can maintain a plate-like shape through the protective film 113.

Here, the protective film 113 attached to at least one surface of the upper surface and the lower surface of the sheet body 110 may be a removable release film. Thus, when the protective film 113 is removed from the sheet body 110, the second adhesive layer 112 disposed between the sheet body 110 and the protective film 113 may be exposed to the outside. Therefore, the magnetic field shielding sheets 100 and 100' according to one embodiment of the present invention may be attached to other components using the second adhesive layer 112.

In this case, as shown in FIGS. 2, 3, 6, and 7, the magnetic field shielding sheet 100 or 100' according to one embodiment of the present invention may include the through-portions 120 or 120' formed in an inner region of the sheet body 110 and the plurality of cracks 130 extending from the through-portions 120 or 20'.

As an example, the through-portions 120 or 120' may be formed to pass through the sheet body 110, and the plurality of cracks 130 may be formed to extend from the through-portions 120 or 120' to the inside of the sheet body 110.

In this case, the plurality of cracks 130 formed from the through-portions 120 or 120' may or may not be connected to each other. In addition, only some cracks of the plurality of cracks 130 may be connected to each other.

Here, when the protective film 113 is attached to at least one surface of the sheet body 110 as described above, the through-portion 120 or 120' may be formed to pass through both the sheet body 110 and the protective film 113.

In addition, the plurality of cracks 130 may be formed by being induced from the through-portions 120 or 120' through an external force applied to the sheet body 110 in a process of forming the through-portions 120 or 120' in the sheet body 110.

Accordingly, in the magnetic field shielding sheet 100 or 100' according to one embodiment of the present invention, an overall resistance can be increased through the through-portions 120 or 120' and the plurality of cracks 130 formed in the sheet body 110, thereby reducing an influence due to an eddy current.

That is, the through-portions 120 or 120' and the plurality of cracks 130 formed in the sheet body 110 may function as an eddy current reducing portion for reducing an eddy current.

Here, the through-portion 120 or 120' may be formed to have a predetermined width and length, and one or more appropriate through-portions 120 or 120' may be formed. In addition, the through-portion 120 or 120' may be formed to have a length greater than a width. In addition, the total number of the plurality of cracks 130 may be relatively greater than the total number of the through-portions 120 or 120'.

As a non-limiting example, the through-portion 120 or 120' may be formed in a linear shape having a length greater than a width.

In this case, in the magnetic field shielding sheet 100 or 100' according to one embodiment of the present invention, the through-portions 120 or 120' and the plurality of cracks 130 may be formed locally in a partial area of the total area of the sheet body 110.

That is, in consideration of an arrangement relationship with the antenna 211 for transmitting or receiving wireless power, the through-portions 120 or 120' and the plurality of cracks 130 may be formed locally in a partial area of the total area of the sheet body 110.

Figure 2:
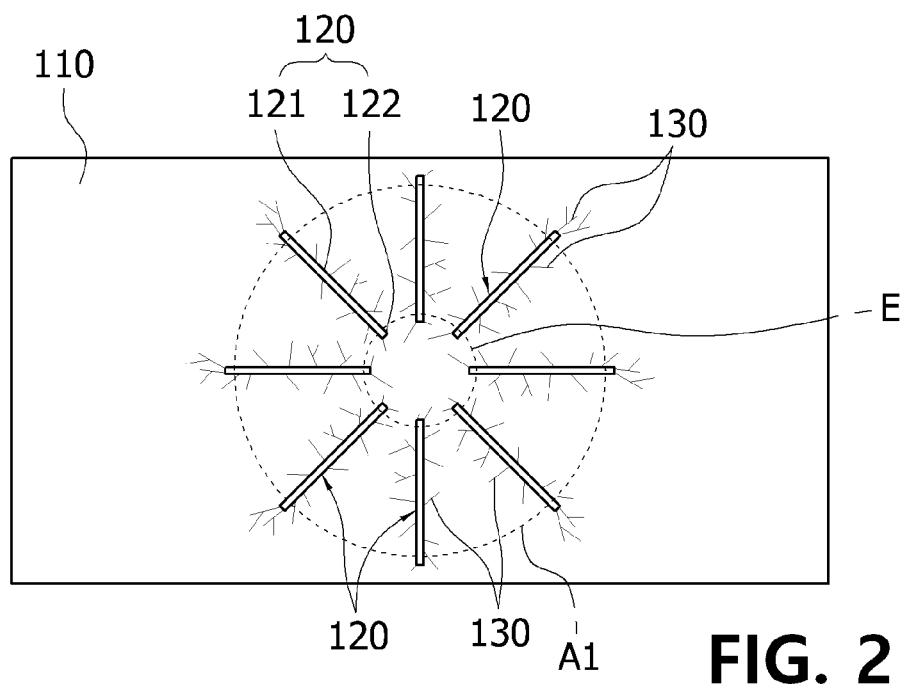
FIG. 2 is a view conceptually illustrating through-portions, which may be formed in an arrangement region corresponding to a pattern portion of an antenna in FIG. 1, and cracks induced from the through-portions.
Figure 3:
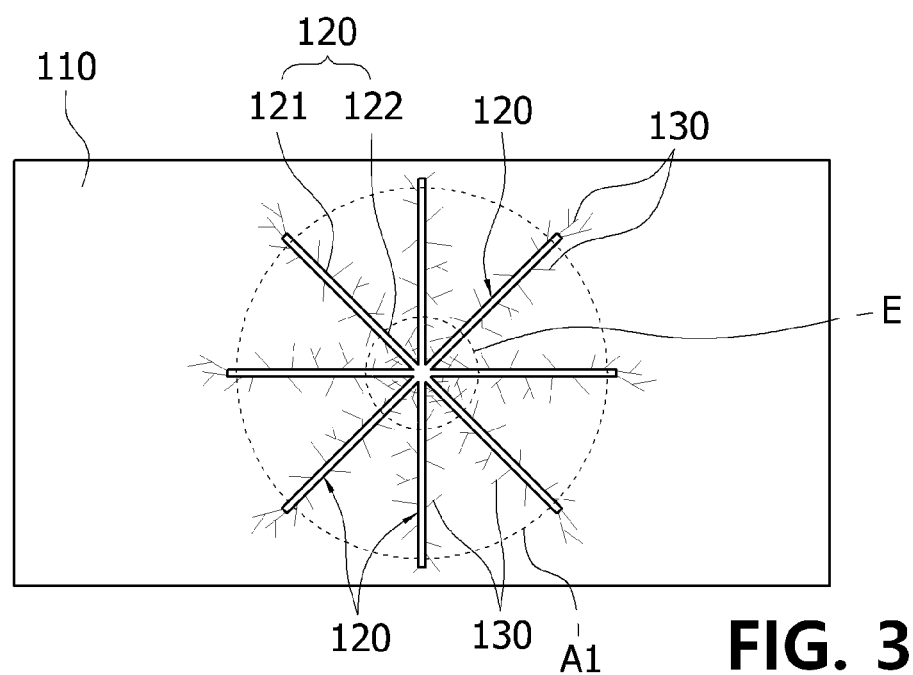
FIG. 3 is a view conceptually illustrating through-portions having another shape, which may be formed in the arrangement area corresponding to the pattern portion of the antenna in FIG. 1, and cracks induced from the through-portions.

As an example, as shown in FIGS. 2 and 3, the through-portions 120 and the plurality of cracks 130 may be formed in an arrangement region A1, in which the pattern portion P of the antenna 211 is disposed, of the total area of the sheet body 110. In this case, the through-portion 120 may further include a portion extending from the arrangement region A1 toward the hollow portion E of the antenna 211 in addition to the arrangement region A1.

Figure 6:
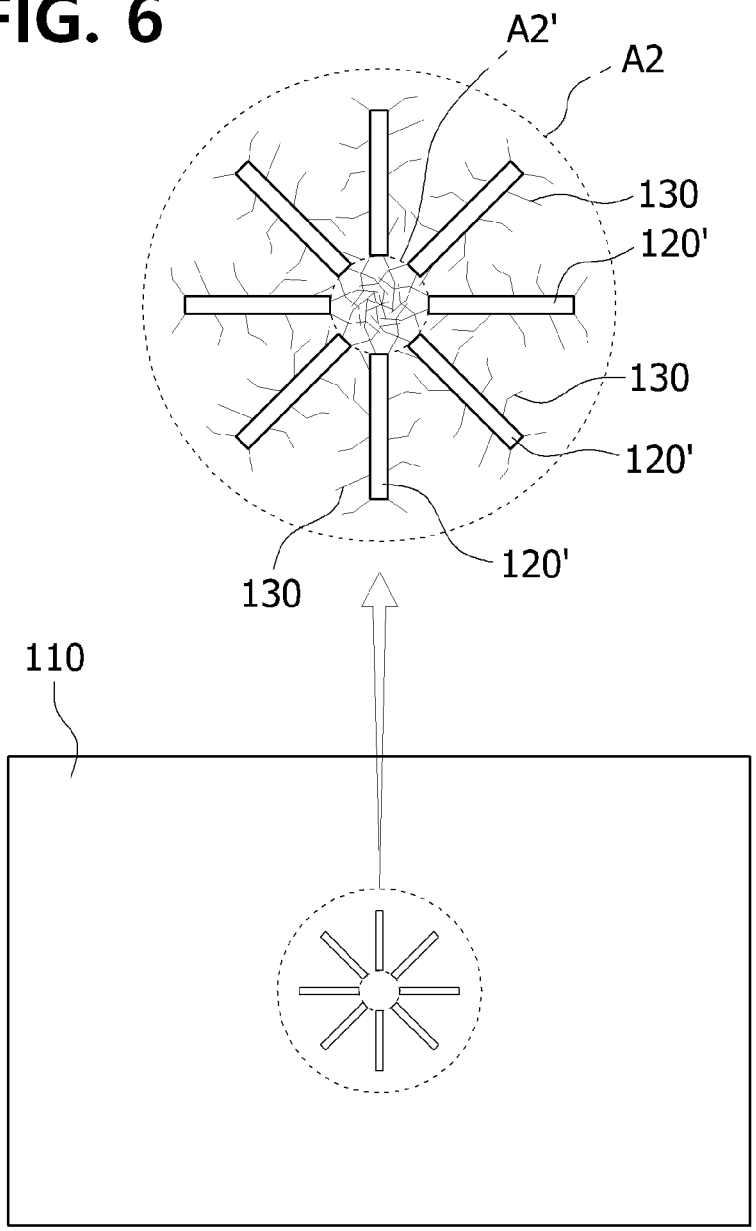
FIG. 6 shows an enlarged view of a corresponding region corresponding to a hollow portion of an antenna in FIG. 5 and a view conceptually illustrating through-portions and cracks induced from the through-portions.
Figure 7:
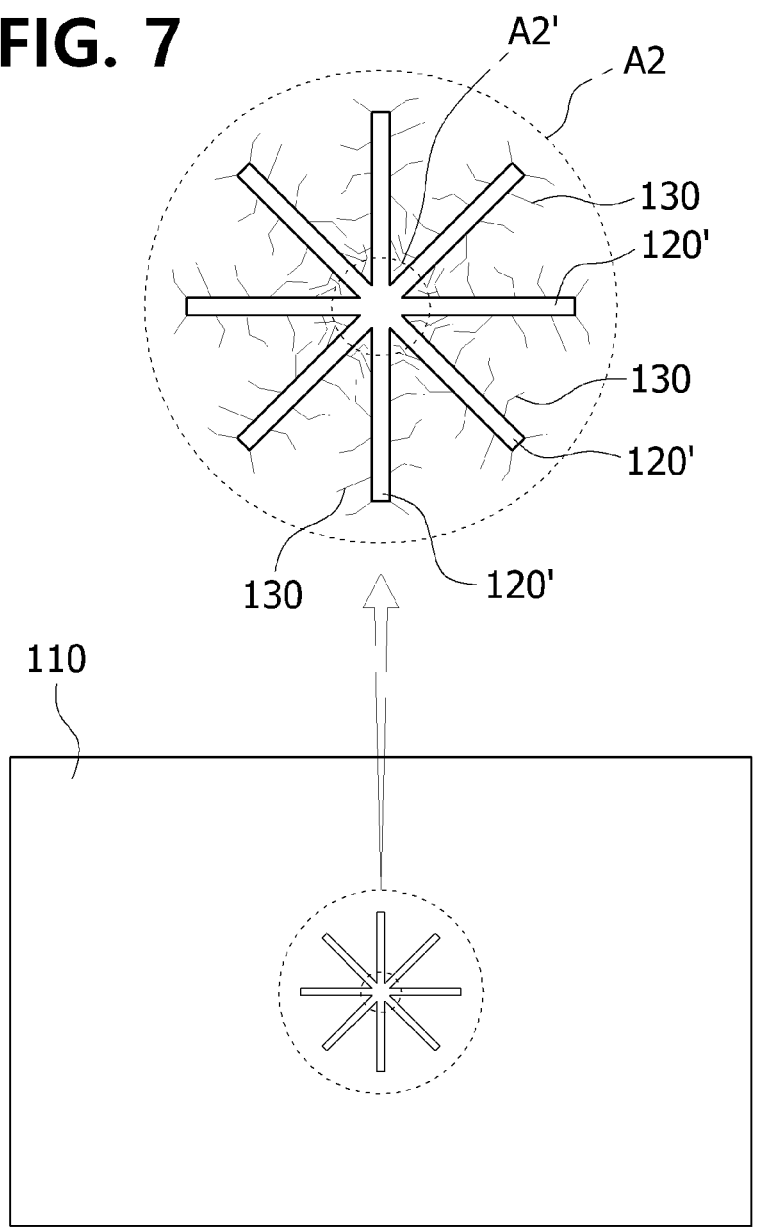
FIG. 7 shows views conceptually illustrating through-portions having another shape, which may be formed in the corresponding region corresponding to the hollow portion of the antenna in FIG. 5, and cracks induced from the through-portions.

As another example, as shown in FIGS. 6 and 7, the through-portions 120' and the plurality of cracks 130 may be formed only in a partial area A2, in which a magnetic flux is concentrated, of the total area of the sheet body 110.

Thus, in the magnetic field shielding sheet 100 or 100' according to one embodiment of the present invention, since, in the total area thereof, the through-portions 120 or 120' and the plurality of cracks 130 are partially formed only in a partial area in which the pattern portion P of the antenna 211 is disposed or only in a partial area corresponding to the hollow portion E of the antenna 211, the overall resistance of the sheet itself can be increased to minimize an influence due to an eddy current, and also, the magnetic field shielding sheet 100 or 100' may have a high magnetic permeability of 2,000 or more while having a very thin thickness.

As a non-limiting example, the magnetic field shielding sheets 100 and 100' according to one embodiment of the present invention may have a high magnetic permeability of 2,000 or more even while having a very thin overall thickness of 55 μm to 85 μm.

For this reason, in the magnetic field shielding sheets 100 and 100' according to one embodiment of the present invention, it is possible to increase an inductance of the antennas 211 and 212 while implementing thinning through a very thin thickness.

Figure 10:
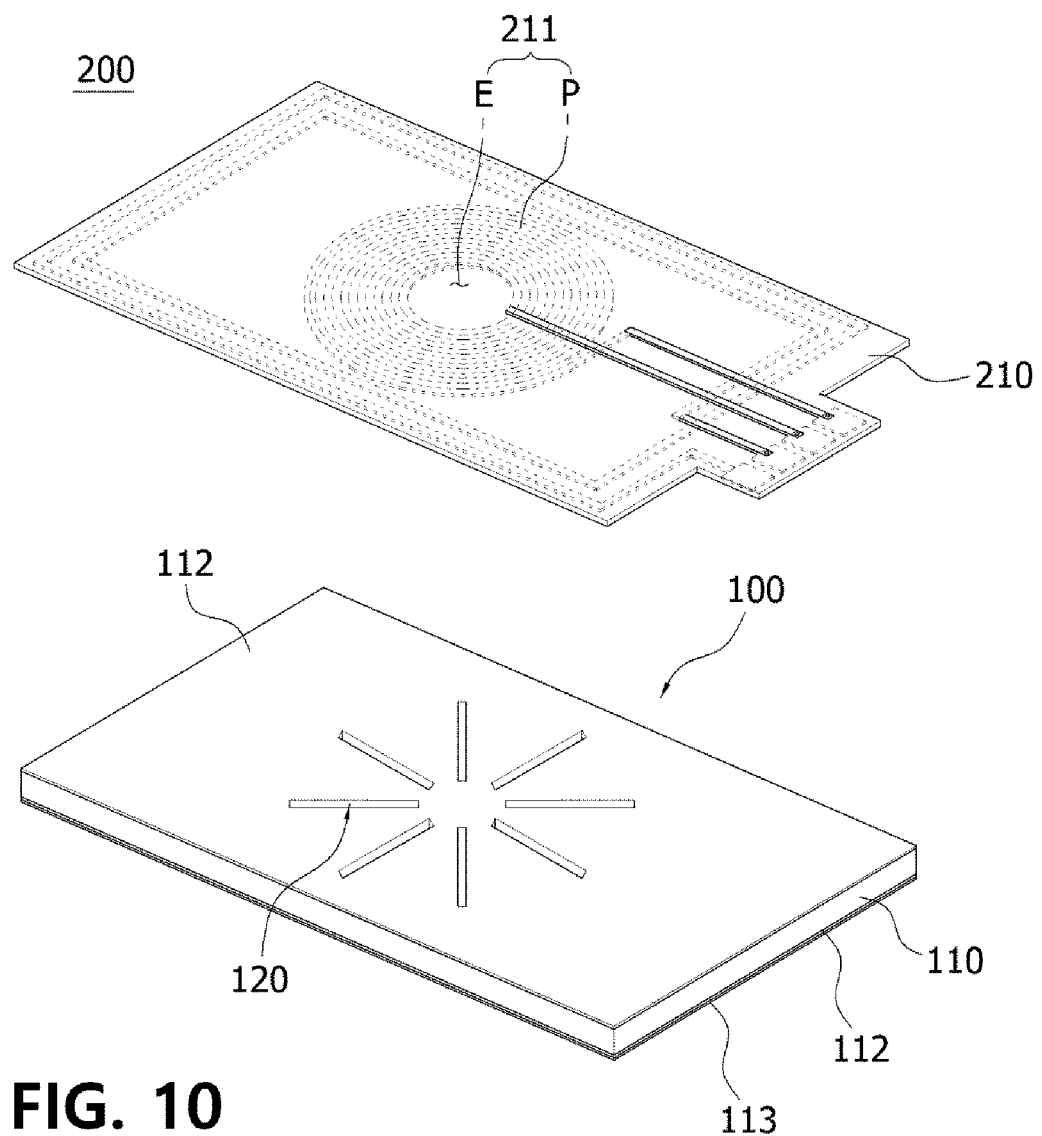
FIG. 10 shows views illustrating a wireless power receiving module, to which the magnetic field shielding sheet of FIG. 1 is applied, as a wireless power receiving module according to one embodiment of the present invention.

Specifically, when the antenna 211 is disposed on one surface of the magnetic field shielding sheet 100 according to one embodiment of the present invention as shown in FIGS. 1 and 10, the through-portions 120 and the plurality of cracks 130 extending from the through-portions 120 may be formed in the arrangement region A1, in which the pattern portion P of the antenna 211 is disposed, of the total area of the sheet body 110.

In this case, the through-portion 120 may include a first portion 121 formed in the arrangement region A1 in which the pattern portion P of the antenna is disposed and may further include a second portion 122 extending from the first portion 121 to a position corresponding to the hollow portion E of the antenna. The plurality of cracks 130 may include portions formed from the second portion 122.

As a non-limiting example, as shown in FIGS. 2 and 3, the plurality of through-portions 120 may be formed in the arrangement region A1, the plurality of through-portions 120 formed in the arrangement region A1 may be spaced apart from each other at intervals, and the plurality of cracks 130 may be formed to extend from each of the plurality of through-portions 120.

In this case, as shown in FIG. 2, the plurality of through-portions 120 may be formed radially with respect to a center point of the hollow portion E of the antenna 211, and the plurality of through-portions 120 may be formed so as to not be connected to each other.

In addition, as shown in FIG. 3, the plurality of through-portions 120 may be formed radially with respect to the center point of the hollow portion E of the antenna, and the plurality of through-portions 120 may be formed such that at least portions thereof are connected to each other in a region corresponding to the hollow portion E of the antenna.

In this case, the second portions 122 of the plurality of through-portions 120 may be formed in the region corresponding to the hollow portion E of the antenna, and the plurality of second portions 122 may be formed to be connected to each other at the center point of the hollow portion E of the antenna.

Thus, the plurality of through-portions 120 may be connected to each other through the second portions 122 to be formed into one through-portion. Here, at a position corresponding to the hollow portion E of the antenna, partial areas including the center point, which are connected to each other through the second portions 122, may be divided into a plurality of pieces through the cracks 130 extending from each of the second portions 122.

Accordingly, a partial area including the center point of the hollow portion E within the region corresponding to the hollow portion E of the antenna may be formed in a shape similar to that of a sheet formed by being separated through a conventional flake process.

In the present embodiment, the through-portion 120 may have a width of 0.1 mm to 0.4 mm, and the total number of the through-portions 120 formed in the sheet body 110 may be 4 to 16.

In this case, when the width of the through-portion 120 exceeds 0.4 mm, an amount of magnetic field leaking through the through-portion 120 formed in the sheet body 110 may be increased, and thus, the performance of the sheet body 100 as a shielding sheet may be degraded.

On the other hand, when the width of the through-portion 120 is less than 0.1 mm, a process of forming the through-portion 120 in the sheet body 110 may be difficult, and thus, productivity may be decreased.

In addition, as compared with a case in which the total number of the through-portions formed in the sheet body 110 is 4 to 16, when the total number of the through-portions 120 formed in the sheet body 110 is 17 or more, as the total number of the through-portions 120 is increased, a resistance of the sheet itself is increased, but there are problems in that an effect of an additional reduction in eddy current is insignificant and it is difficult to implement a high permeability of 2,000 or more.

On the other hand, as compared with a case in which the total number of the through-portions formed in the sheet body 110 is 4 to 16, when the total number of the through-portions 120 formed in the sheet body 110 is less than 4, it is advantageous in implementing a high permeability of 2,000 or more, but a resistance of the sheet itself is not sufficient, which may cause characteristic degradation due to eddy current loss.

Figure 11:
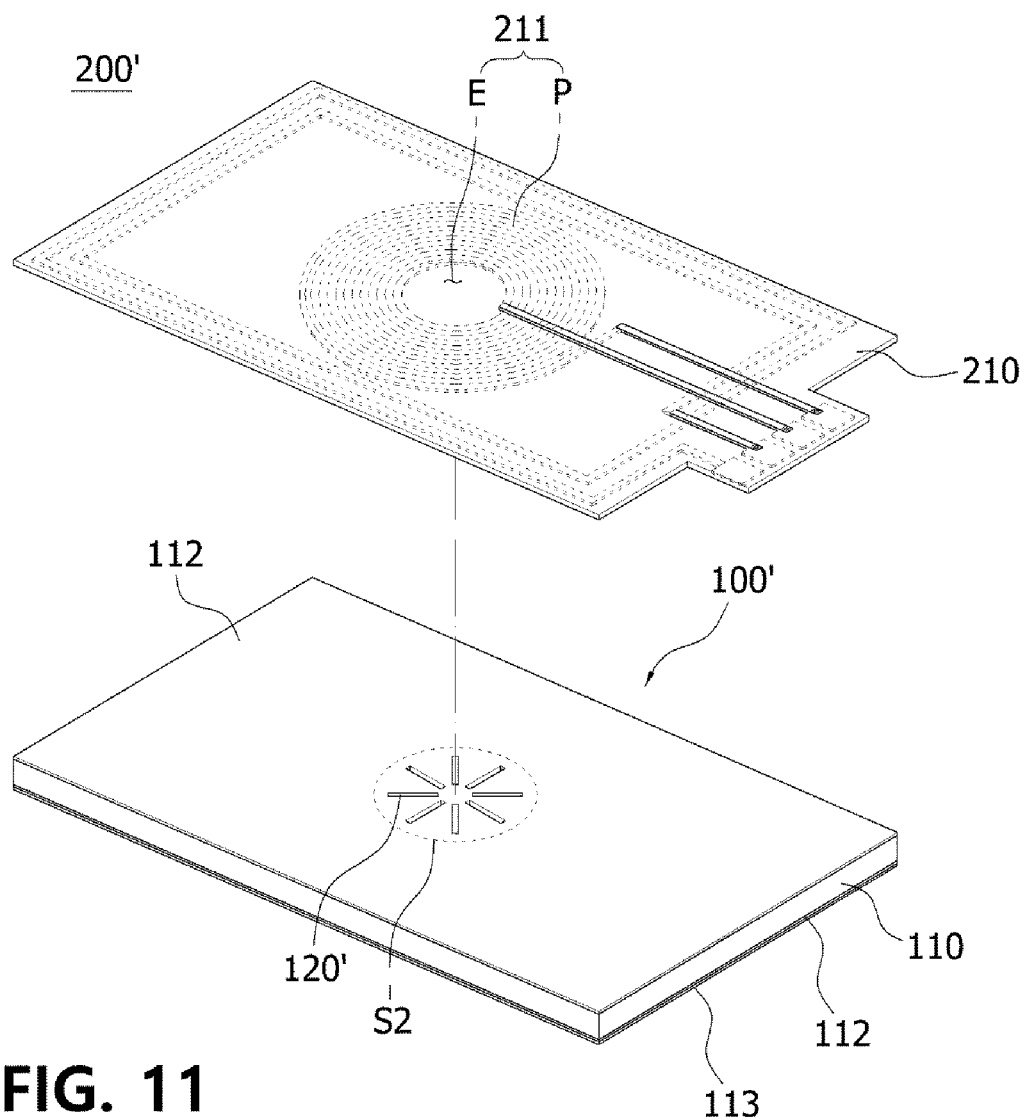
FIG. 11 shows views illustrating a wireless power receiving module, to which the magnetic field shielding sheet of FIG. 5 is applied, as a wireless power receiving module according to another embodiment of the present invention.

Alternatively, as shown in FIGS. 5 and 11, when the antenna 211 is disposed on one surface of the magnetic field shielding sheet 100' according to one embodiment of the present invention, the through-portions 120' and the plurality of cracks 130 extending from the through-portions 120' may be formed in a corresponding region A2, which corresponds to the hollow portion E of the antenna 211, of the total area of the sheet body 110.

As a non-limiting example, as shown in FIGS. 6 and 7, the plurality of the through-portions 120' may be formed in the corresponding region A2, the plurality of through-portions 120' formed in the corresponding region A2 may be spaced apart from each other at intervals, and the plurality of cracks 130 may be formed to extend from each of the plurality of through-portions 120'.

In this case, as shown in FIG. 6, the plurality of through-portions 120' may be formed radially with respect to a center point of the corresponding region A2. In this case, in the total area of the corresponding region A2, a partial region A2' including a center point of the corresponding region may be divided into a plurality of pieces through the cracks 130 extending from each of the plurality of through-portions 120'.

In addition, as shown in FIG. 7, the plurality of through-portions 120' may be formed radially with respect to the center point of the corresponding region A2, and the plurality of through-portions 120' may be formed such that at least portions thereof are connected to each other.

In this case, one ends of the plurality of through-portions 120' may be connected to each other at the center point of the corresponding region A2. Thus, the plurality of through-portions 120' may be connected to each other to be formed into one through-portion. Here, in the total area of the corresponding region A2, the partial region A2' including the center point at which the plurality of through-portions 120' are connected to each other may be divided into a plurality of pieces through the cracks 130 extending from each of the plurality of through-portions 120' of which one ends are connected to each other.

Thus, since a partial area including the center point in the total area of the corresponding region A2 is divided into a plurality of pieces through the cracks 130 extending from the plurality of through-portions 120', the partial area may be formed in a shape similar to that of a sheet formed by being separated through a conventional flake process.

In the present embodiment, the through-portion 120' may have a width of 0.1 mm to 0.4 mm.

In this case, when the width of the through-portion 120' exceeds 0.4 mm, an amount of magnetic field leaking through the through-portion 120' formed in the sheet body 110 may be increased, and thus, the performance of the sheet body 100 as a shielding sheet may be degraded.

On the other hand, when the width of the through-portion 120' is less than 0.1 mm, a process of forming the through-portion 120' in the sheet body 110 may be difficult, and thus, productivity may be decreased.

However, the arrangement form of the through-portion 120 or 120' in the magnetic field shielding sheet 100 or 100' according to one embodiment of the present invention is not limited thereto, and as long as the through-portion 120 or 120' is formed in the arrangement region A1 or the corresponding region A2', the through-portion 120 or 120' may be formed through various methods.

That is, as shown in FIGS. 4(a) to 4(f), the plurality of through-portions 120 may be formed as through-portions including at least one type of a first through-portion 120a, a second through-portion 120b, a third through-portion 120c, and a fourth through-portion 120d. The plurality of through-portions 120 may be formed in the arrangement region A1 through various methods.

In addition, as shown in FIGS. 8(a) to 8(f), the plurality of through-portions 120' may be formed as through-portions including at least one type of a first through-portion 120a', a second through-portion 120b', and a third through-portion 120c'. The plurality of through-portions 120' may be formed in the corresponding region A2 through various methods.

Here, the first through-portion 120a or 120a' may be a linear through-portion formed in a direction perpendicular to a width direction or a length direction of the sheet body 110, and the second through-portion 120b or 120b' may be a linear through-portion formed in a direction parallel to the width direction or the length direction of the sheet body 110.

In addition, the third through-portion 120c or 120c' may be a linear through-portion formed to be inclined at a predetermined angle with respect to the width direction or the length direction of the sheet body 110, and the fourth through-portion 120d may be a curved through-portion formed in an arc shape having a predetermined curvature.

However, a forming method of the plurality of through-portions 120 and 120' is not limited thereto. A forming method of the through-portions 120 having shapes shown in FIGS. 4(a) to 4(f) may be applied as a forming method of the through-portion 120' of FIG. 5, and a forming method of the through-portions 120' having shapes shown in FIGS. 8(a) to 8(f) may be applied as a forming method of the through-portion 120 of FIG. 1.

The magnetic field shielding sheet 100 or 100' according to one embodiment of the present invention may be implemented as a wireless power receiving module 200 or 200' for wireless power transfer.

That is, as shown in FIGS. 10 and 11, the wireless power receiving module 200 or 200' may include a wireless power reception antenna 211 for receiving wireless power and a magnetic field shielding sheet 100 or 100' disposed on one surface of the wireless power reception antenna 211.

Here, the magnetic field shielding sheets 100 and 100' constituting the wireless power receiving modules 200 and 200' shown in FIGS. 10 and 11 may be the magnetic field shielding sheets 100 and 100' shown in FIGS. 1 to 9.

Such wireless power receiving modules 200 and 200' may include only the wireless power reception antenna 211 but may further include various antennas performing different functions.

As an example, the wireless power receiving modules 200 and 200' may further include at least one of an MST antenna for magnetic payment and an NFC antenna 212 for near field communication in addition to the wireless power reception antenna 211.

In addition, the wireless power receiving modules 200 and 200' may be applied to portable terminal devices such as mobile phones and tablet personal computers (PCs).

Meanwhile, the magnetic field shielding sheets 100 and 100' may be manufactured through the following manufacturing method.

That is, as shown in FIG. 12, a manufacturing method of a magnetic field shielding sheet according to one embodiment of the present invention may include operation S1 of providing a sheet body M having a first area, operation S2 of performing primary punching of the sheet body M, and operation S3 of performing secondary punching of the sheet body M.

Operation S1 of providing the sheet body M having the first area may be a preparing operation of cutting the sheet body M having the first area into a predetermined size according to the intended use and purpose to manufacture a shielding sheet 300 or 300' which is a final product. Here, the shielding sheet 300 may be the magnetic field shielding sheet 100 or 100' described above.

Figure 18A:
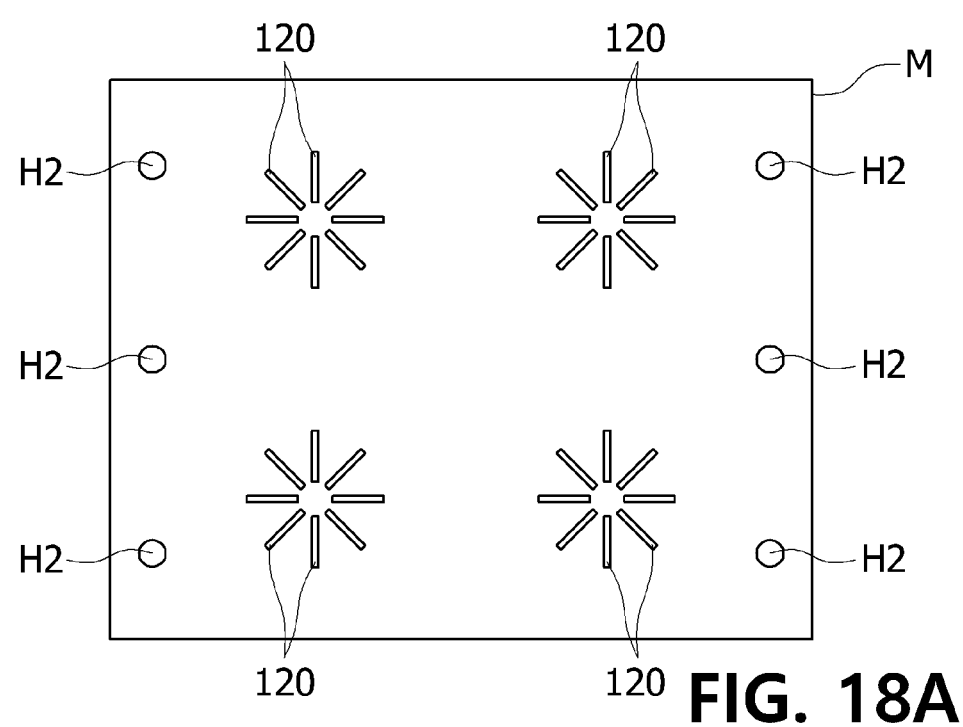
FIG. 18A is a plan view illustrating a multi-layered sheet in a state in which primary punching is completed using the mold of FIGS. 14A and 14B.
Figure 19A:
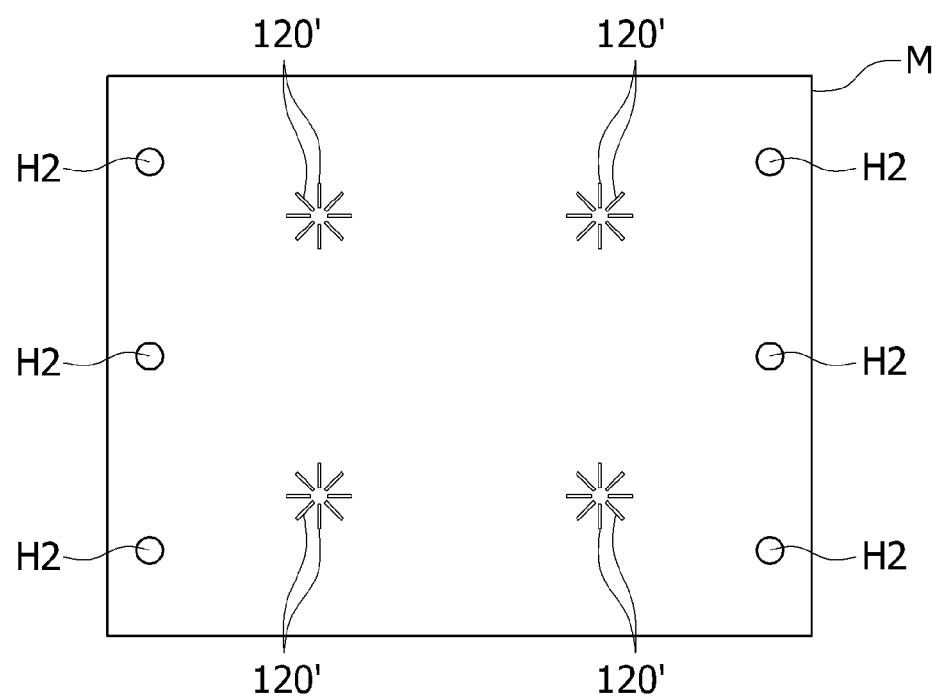
FIG. 19A is a plan view illustrating a multi-layered sheet in a state in which primary punching is completed using the mold of FIGS. 15A and 15B.
Figure 19B:
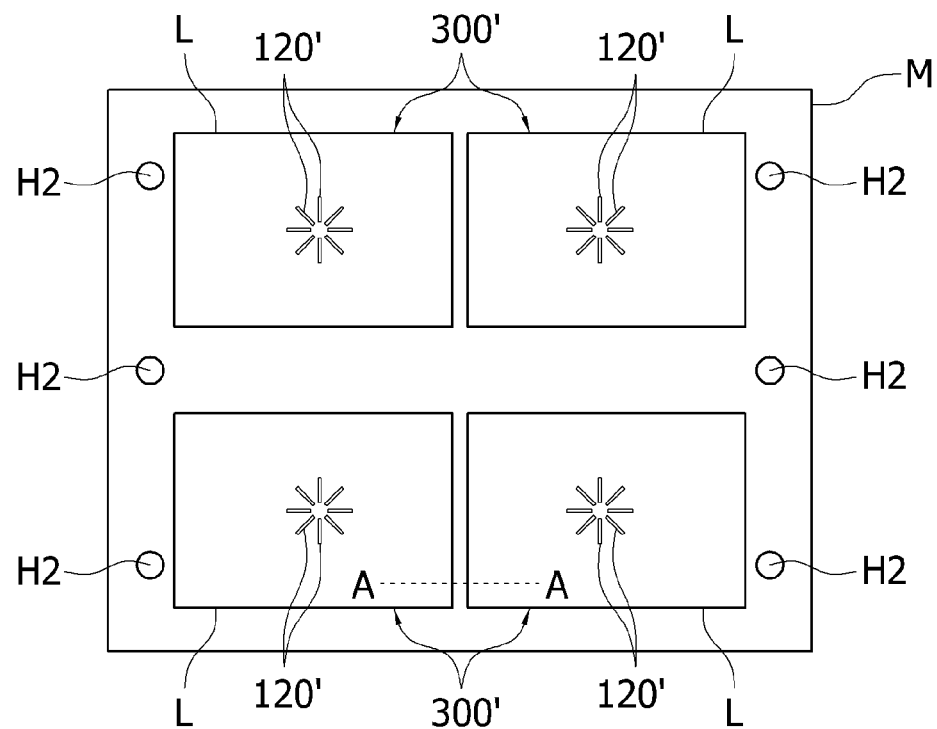
FIG. 19B is a plan view illustrating a multi-layered sheet in a state in which secondary punching on the multi-layered sheet of FIG. 19A is completed using the mold of FIG. 17.
Figure 20:
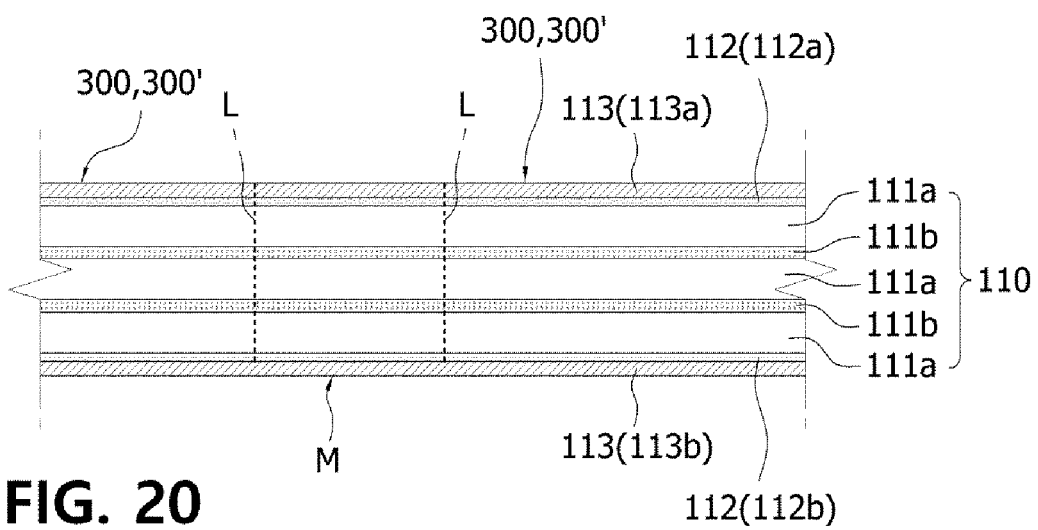
FIG. 20 is a cross-sectional view taken along portion A-A in FIGS. 18B and 19B.

That is, the shielding sheet 300 may include a sheet body 110 having a second area as shown in FIG. 20, and as shown in FIGS. 18A and 19B, through-portions 120 or 120' and cracks 130 may be formed in the sheet body 110 having the second area through operation S2 of performing primary punching of the sheet body M having the first area and operation S3 of performing secondary punching of the sheet body M having the first area.

Specific details thereof will be described below.

Such a sheet body M may be a plate-shaped sheet having the first area and may be made of a magnetic material.

In this case, the sheet body M having the first area may be made of a material including a metal component such that the plurality of cracks 130 may be induced from the through-portions 120 or 120' through an external force in a process of forming the through-portions 120 or 120' in the sheet body M having the first area. The sheet body M may be a heat-treated sheet.

As an example, the sheet body M having the first area may be a ribbon sheet 111a including at least one selected from an amorphous alloy and a nanocrystalline alloy.

Here, the sheet body M having the first area may be formed as a single-layered ribbon sheet 111a. However, the sheet body 100 may be a multi-layered sheet in which a plurality of ribbon sheets 111a are stacked in a multi-layer through a first adhesive layer 111b or may be a hybrid sheet in which a ribbon sheet made of an amorphous alloy and a ribbon sheet made of a nanocrystalline alloy are combined.

As a non-limiting example, the sheet body M having the first area may be a multi-layered sheet in which the plurality of ribbon sheets 111a including at least one selected from an amorphous alloy and a nanocrystalline alloy are stacked through the first adhesive layer 111b such that the sheet body 110 having the second area, which constitutes the shielding sheet 300 that is the final product, may be formed as a multi-layered sheet.

In addition, each of the ribbon sheets 111a constituting the sheet body M having the first area may be a heat-treated ribbon sheet, and a protective film 113 may be in a state of being attached to least one surface of an upper surface and a lower surface of the sheet body M having the first area through a second adhesive layer 112.

The protective film 113 may be attached to each of the upper surface and the lower surface of the sheet body M having the first area.

That is, operation S1 of providing the sheet body M having the first area may include an operation of stacking the plurality of ribbon sheets 111a through the first adhesive layer 111b to form a multi-layered sheet having the first area formed in a multi-layer and an operation of attaching the protective film 113 to at least one surface of an upper surface and a lower surface of the multi-layered sheet through the second adhesive layer 112 in which an adhesive is applied on both surfaces of a substrate.

Here, the protective film 113 attached to the sheet body M having the first area may be a removable release film.

Thus, when an outer edge L defining the second area is formed in the sheet body M having the first area through operation S3 of performing secondary punching of the sheet body M to be described below, the shielding sheet 300 or 300' having the second area may be separated from the sheet body M having the first area in a state in which the second adhesive layer 112 is exposed at one surface thereof.

Accordingly, the shielding sheet 300 or 300' separated from the sheet body M having the first area may be attached to other components using the second adhesive layer 112 formed on one surface thereof.

As a non-limiting example, as shown in the enlarged view of FIG. 13, the sheet body M having the second area may include one pair of protective films respectively attached to an upper surface and a lower surface thereof through the second adhesive layer 112. In this case, the second adhesive layer 112 may be formed by applying an adhesive on both surfaces of a substrate.

However, the present invention is not limited thereto, and the protective film 113 may be attached to only one surface of the upper surface and the lower surface of the sheet body 110 having the first area through the second adhesive layer 112. In addition, the second adhesive layer 112 may be a liquid or gel adhesive.

Operation S2 of performing primary punching of the sheet body M having the first area may be an operation of forming the through-portions 120 or 120' having a predetermined width and length in an inner region of the sheet body M having the first area and forming the plurality of cracks 130 extending from the through-portions 120 or 120'. Here, the through-portion 120 or 120' may be a linear through-portion having a predetermined width and length.

That is, operation S2 of performing primary punching of the sheet body M having the first area may be an operation of forming the through-portions 120 or 120' in an inner region of the outer edge L defined through operation S3 of performing secondary punching of the sheet body M having the first area to be described below and may be an operation of simultaneously forming the plurality of cracks 130 induced from the through-portions 120 or 120' together with the through-portions 120 or 120'.

Operation S2 of performing primary punching of the sheet body having the first area may be performed using a punching apparatus shown in FIG. 13.

As an example, the punching apparatus may include an upper mold 10 for primary punching provided with a plurality of protrusions 12 formed on one surface thereof to protrude to a predetermined height, a lower mold 20 for primary punching disposed below the upper mold 10 for primary punching and provided with a plurality of opening holes 22 formed to pass therethrough at positions thereof corresponding to the plurality of protrusions 12, and a plurality of guide bars G for guiding a movement direction of the upper mold 10 for primary punching.

In this case, the plurality of protrusions 12 and the plurality of opening holes 22 may have shapes corresponding to the through-portions 120 or 120'.

As an example, the plurality of protrusions 12 and the plurality of opening holes 22 may be formed in a linear shape having a predetermined width and length, and one or more appropriate protrusions 12 and one or more appropriate opening holes 22 may be formed. In addition, the plurality of protrusions 12 and the plurality of opening holes 22 may be formed to have a length greater than a width.

Figure 14A:
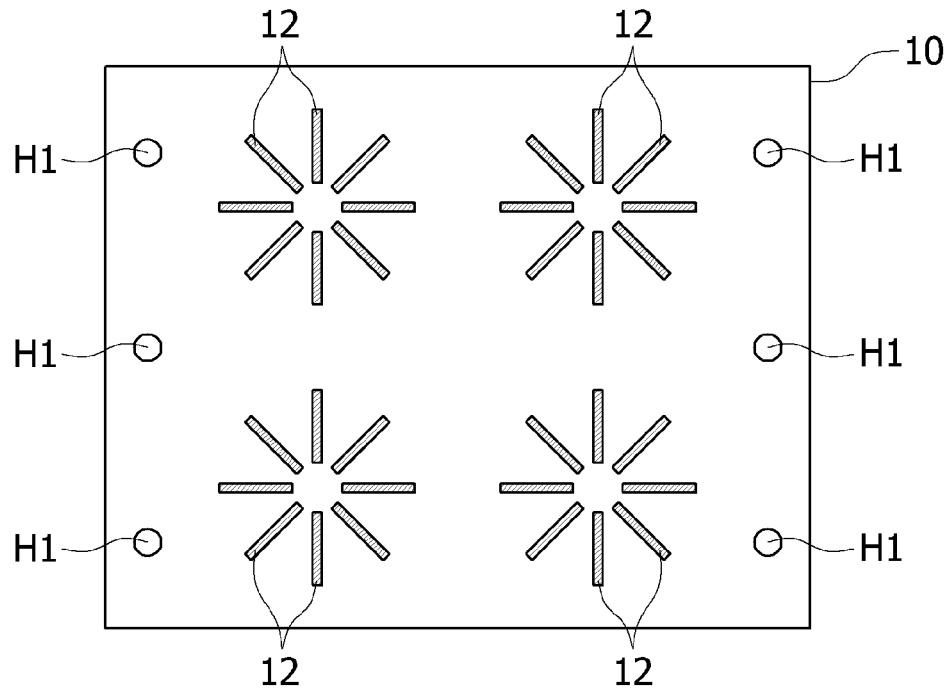
Figure 14B:
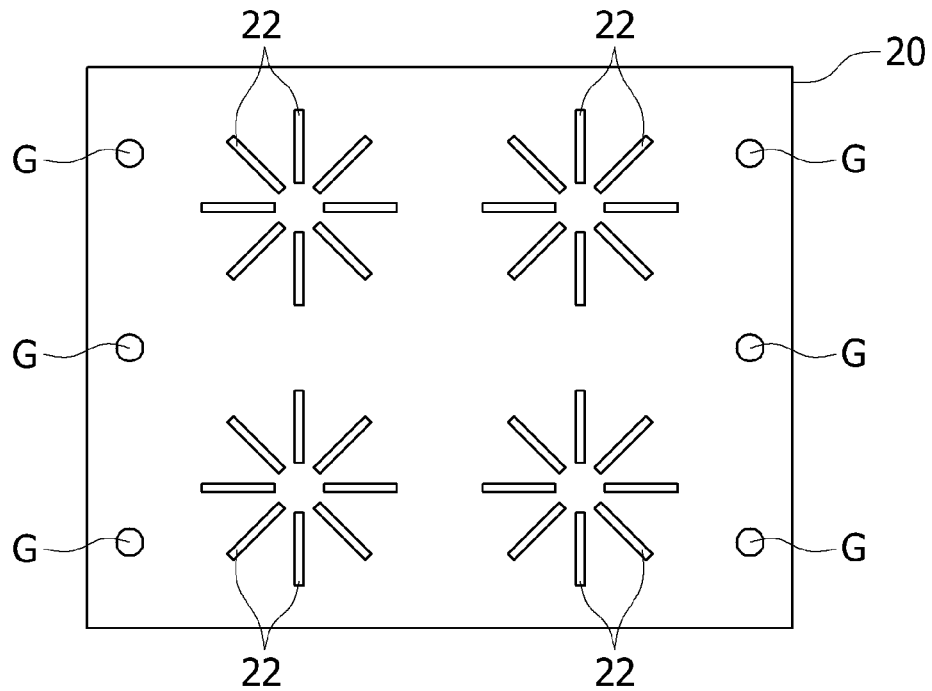

In addition, as shown in FIGS. 14A and 14B, the plurality of protrusions 12 may be spaced apart from each other, and the plurality of opening holes 22 may be spaced apart from each other. The plurality of protrusions 12 and the plurality of opening holes 22 may be disposed radially with respect to a virtual center point.

In this case, first guide holes H1 through which the guide bars G may pass may be formed in the upper mold 10 for primary punching, and one or more second guide holes H2 through which the guide bars G may pass may be formed to pass through the sheet body M having the first area.

Accordingly, when the guide bar G is inserted into the first guide hole H1, a movement direction of the upper mold 10 for primary punching may be guided along the guide bar G, and when the guide bar G is inserted into the second guide hole H2, the sheet body M having the first area may be prevented from moving.

Thus, in a state in which the guide bars G are inserted into one or more second guide holes H2, the sheet body M having the first area may be disposed to be positioned between the upper mold 10 for primary punching and the lower mold 20 for primary punching, and one surface thereof may be pressed through movement of the upper mold 10 for primary punching.

Accordingly, when the upper mold 10 for primary punching is lowered during a primary punching process, the protrusions 12 may press the sheet body M having the first area, and the through-portions 120 or 120' may be formed in the sheet body M having the first area at positions corresponding to the protrusions 12 through the pressing by the protrusions 12.

In addition, the plurality of cracks 130, which are induced by a pressing force that is transmitted from the protrusions 12 so as to form the through-portions 120 or 120', may be formed in edges of the through-portions 120 and 120'.

That is, when the primary punching process is performed using the upper mold 10 for primary punching and the lower mold 20 for primary punching having shapes shown in FIGS. 14A to 14B, the through portions 120 or 120' having a predetermined width and length may be formed in the inner region of the sheet body M having the first area at positions corresponding to the protrusions 12.

In this case, in the inner region of the sheet body M having the first area, according to sizes of the protrusions 12 and the opening holes 22 respectively provided in the upper mold 10 for primary punching and the lower mold 20 for primary punching, the through-portions 120 having a shape shown in FIG. 18A may be formed, or the through-portions 120' having a shape shown in FIG. 19A may be formed.

In addition, the cracks 130 having a shape shown in FIG. 2 may be induced from the through-portions 120 to be formed around the through-portions 120 having the shape shown in FIG. 18A, and the cracks 130 having a shape shown in FIG. 6 may be induced from the through-portions 1201 to be formed around the through-portions 120' having the shape shown in FIG. 19A.

Here, cut-out pieces separated from the sheet body M having the first area when the through-portion 120 is formed may fall down through the opening hole 22.

As described above, according to the manufacturing method of a magnetic field shielding sheet according to one embodiment of the present invention, the plurality of cracks 130 induced from the through-portions 120 or 120' may be formed in a punching process of forming the through-portions 120 or 120' having a predetermined width and length, thereby locally forming the through-portions and the cracks induced therefrom only in a partial region of the total area of the shielding sheet 300 which is the final product.

Accordingly, by using the manufacturing method of a magnetic field shielding sheet according to one embodiment of the present invention, it is possible to easily manufacture a shielding sheet satisfying design conditions and required specifications.

Thus, the shielding sheet 300 manufactured through the manufacturing method of a magnetic field shielding sheet according to one embodiment of the present invention can have a high magnetic permeability of 2,000 or more even while having a very thin thickness.

In addition, in the shielding sheet 300 manufactured through the manufacturing method of a magnetic field shielding sheet according to one embodiment of the present invention, an overall resistance thereof can be increased through the through-portions 120 or 120' and the cracks 130 induced from the through-portions 120 or 120', thereby reducing loss due to an eddy current and increasing a Q-value to increase the transmission efficiency of an antenna.

In this case, the protrusion 12 of the upper mold 10 for primary punching and the opening hole 22 of the lower mold 20 for primary punching may be appropriately changed according to a shape of the through-portion 120 or 120' formed in the shielding sheet 300 which is the final product.

Figure 15A:
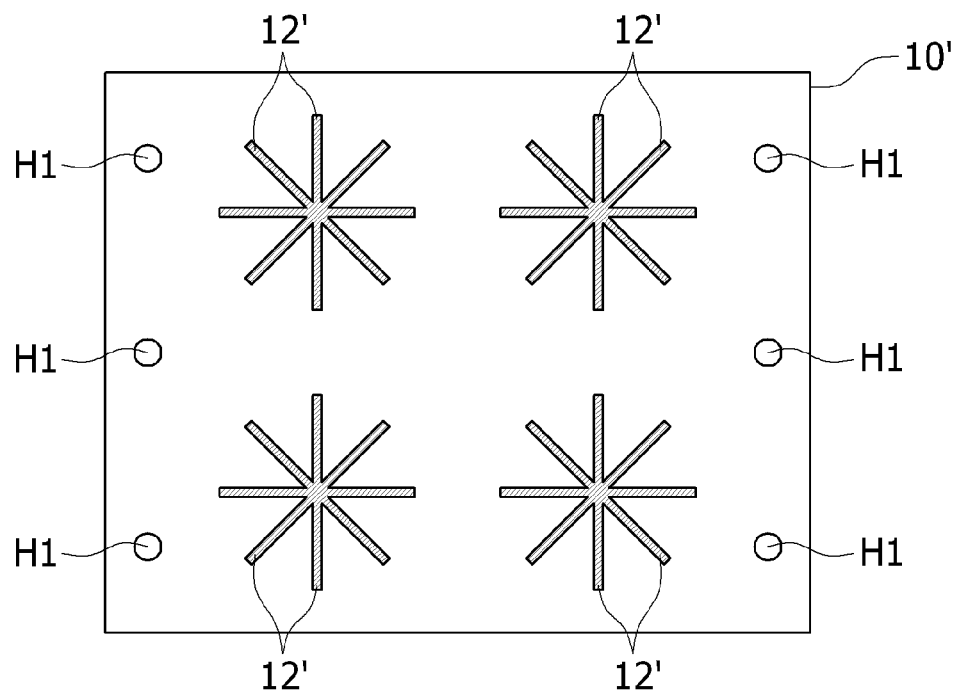
Figure 15B:
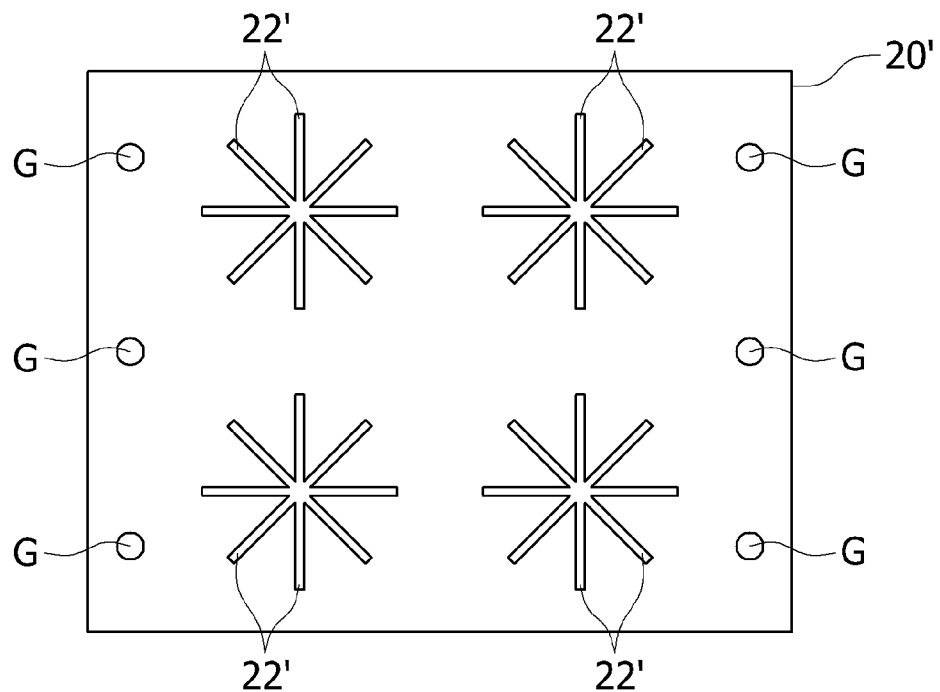

As an example, protrusions 12' of an upper mold 10' for primary punching and opening holes 22' of a lower mold 20' for primary punching may be formed in shapes shown in FIGS. 15A and 15B.

That is, the plurality of protrusions 12' and the plurality of opening holes 22' may be provided as a plurality of groups in inner regions of the upper mold 10' for primary punching and the lower mold 20' for primary punching. The plurality of protrusions 12' may have one ends connected to each other and thus may be formed into one protrusion, and the plurality of opening holes 22' may have one ends connected to each other and thus may be formed into one opening hole.

In addition, the plurality of protrusions 12' may be disposed to be spaced apart from each other at intervals, and the plurality of opening holes 22' may be disposed to be spaced apart from each other at intervals. The plurality of protrusions 12' and the plurality of opening holes 22' may be disposed radially with respect to a virtual center point. At least portions of the plurality of protrusions 12' may be connected to each other, and at least portions of the plurality of opening holes 22' may be connected to each other.

Accordingly, when a primary punching process is performed using the upper mold 10' for primary punching and the lower mold 20' for primary punching having the shapes shown in FIGS. 15A and 15B, the through-portions 120 or 120' having a predetermined width and length may be formed in the inner region of the sheet body M having the first area at positions corresponding to the protrusions 12'.

In this case, according to sizes of the protrusions 12' and the opening holes 22' formed in the upper mold 10' for primary punching and the lower mold 20' for primary punching, in the inner region of the sheet body M having the first area, the through-portions 120 having a shape shown in FIG. 3 and the plurality of cracks 130 induced from the through-portions 120 may be formed, or the through-portions 120' having a shape shown in FIG. 7 and the plurality of cracks 130 induced from the through-portions 120' may be formed.

In addition, although not shown in the drawings, the protrusion 12 or 12' of the upper mold 10 or 10' for primary punching and the opening hole 22 or 22' of the lower mold 20 or 20' for primary punching may be appropriately changed according to the shape of the through-portion formed in the shielding sheet 300 which is the final product. That is, the protrusion 12 or 12' of the upper mold 10 or 10' for primary punching and the opening hole 22 or 22' of the lower mold 20 or 20' for primary punching may be formed so as to correspond to the through-portion 120 or 120' having various shapes shown in FIGS. 4 and 8.

As an example, each of the plurality of protrusions 12 or 12' and the plurality of opening holes 22 or 22' may be disposed radially with respect to a virtual center point and may be disposed perpendicular or parallel to a width direction or a length direction of the sheet body M having the first area.

In addition, each of the plurality of protrusions 12 or 12' and the plurality of opening holes 22 or 22' may be disposed to be inclined at a predetermined angle with respect to the width direction or the length direction of the sheet body M having the first area and may be formed in an arc shape having a predetermined length.

In addition, each of the plurality of protrusions 12 or 12' and the plurality of opening holes 22 or 22' may have a form in which at least two of such four types are combined with each other.

Figure 4:
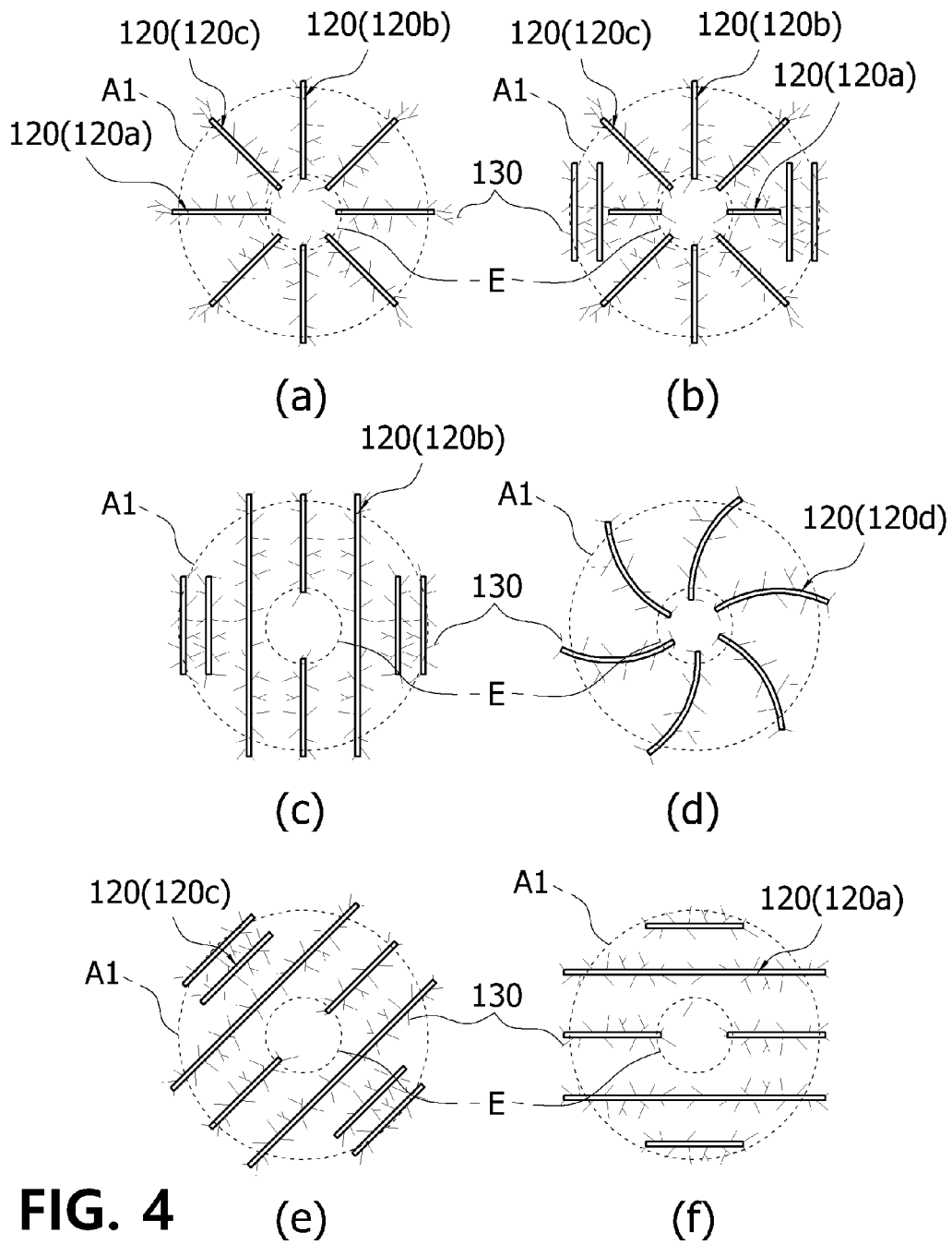
FIG. 4 shows views conceptually illustrating through-portions having various shapes, which may be formed in the arrangement area corresponding to the pattern portion of the antenna in FIG. 1, and cracks induced therefrom.
Figure 8:
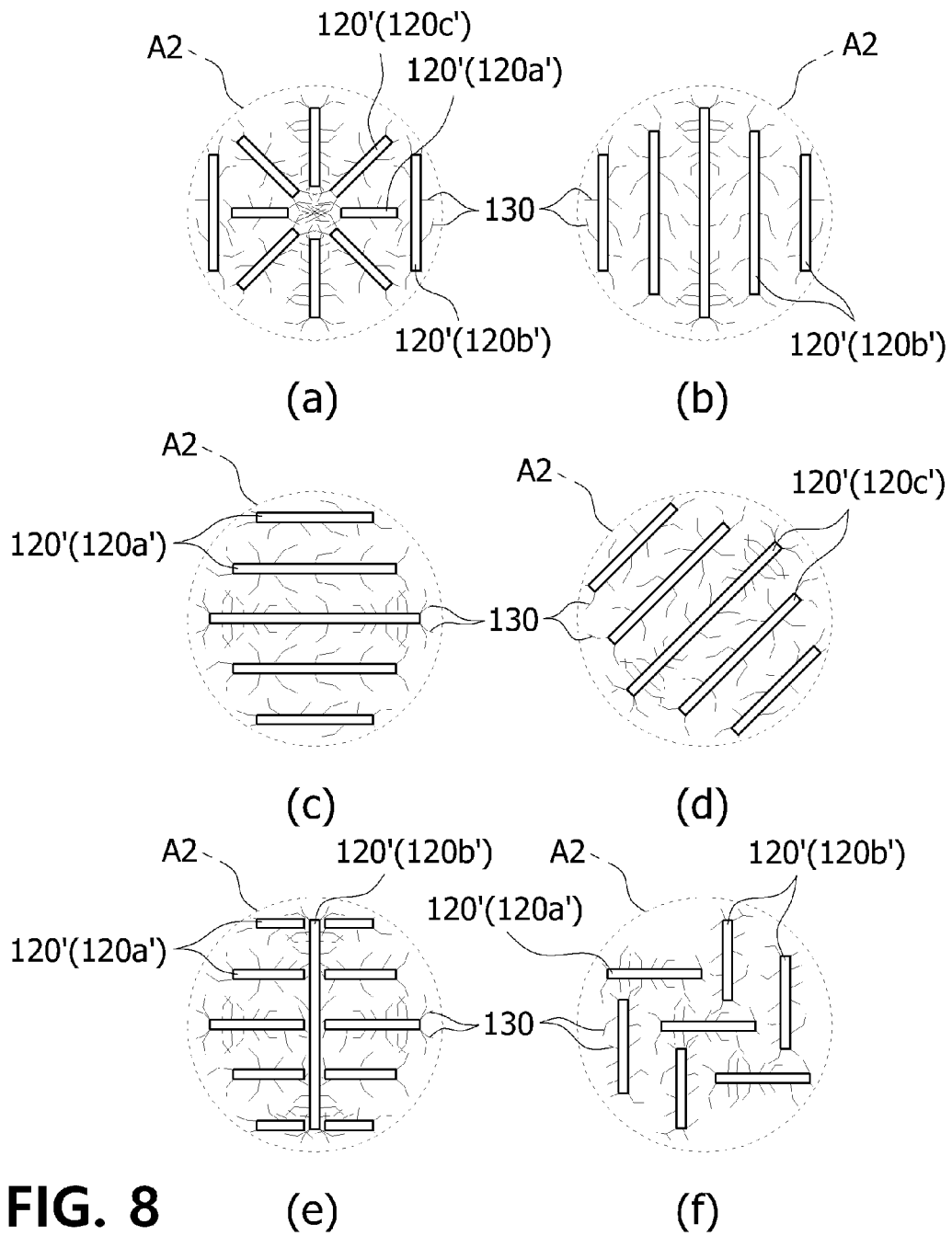
FIG. 8 shows views conceptually illustrating through-portions having various shapes, which may be formed in the corresponding region corresponding to the hollow portion of the antenna in FIG. 5, and cracks induced therefrom.

Thus, in the shielding sheet 300 punched from the sheet body M having the first area through a punching process, various through-portions 120 and 120' and cracks 130 having the shapes shown in FIGS. 4 and 8 may be formed.

Meanwhile, an upper mold 10" for performing primary punching used in operation S 1 of performing primary punching of the sheet body having the first area may be configured to remove cut-out pieces C separated from the sheet body M having the first area in the process of forming the through-portions 120 in the sheet body M having the first area.

Figure 16:
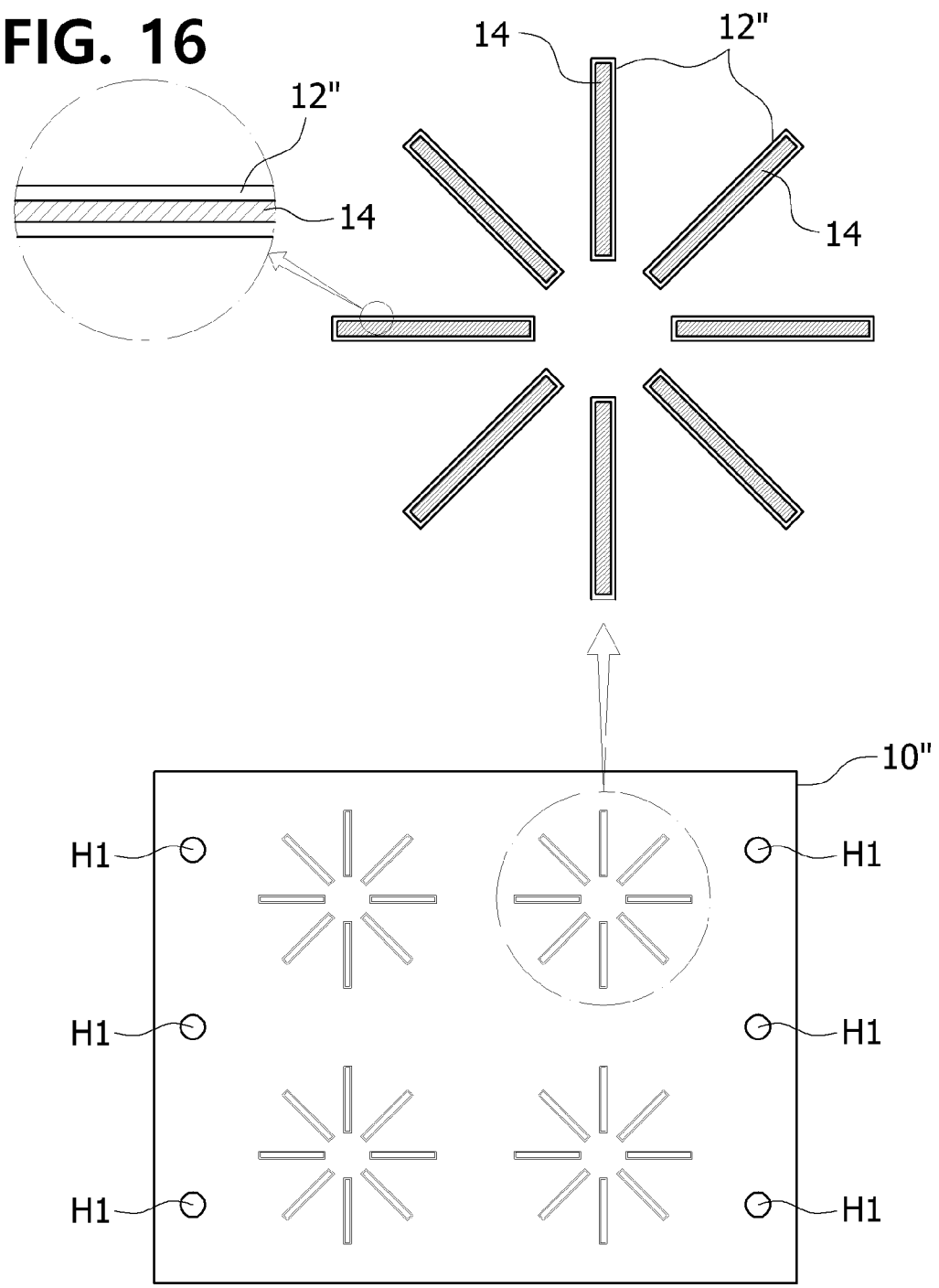
FIG. 16 shows plan views illustrating another type of an upper mold for primary punching applicable in FIG. 13.

That is, the protrusion 12 or 12' in the upper mold 10 or 10' for primary punching may be changed into a shape shown in FIG. 16.

Specifically, as shown in FIG. 16, the upper mold 10" for primary punching may include an edge blade 12" protruding from one surface thereof and a separation member 14 formed inside the edge blade 12" so as to protrude.

Here, the separation member 14 may be formed in a planar shape having a predetermined width and length, and the width and length of the separation member 14 may be relatively less than a width and length of the edge blade 12". In addition, the separation member 14 may be formed to protrude to a predetermined height from an inner bottom surface of the edge blade 12", and a protruding height of the separation member 14 may be the same as a height of the edge blade 12" or may be relatively less than the height than the edge blade 12".

In addition, the edge blade 12' may have a size corresponding to the through-portion 120 or 120'.

Accordingly, when the upper mold 10" for primary punching is pressed against the sheet body M having the first area during the primary punching process, the edge blade 12" may form the through-portion 120 or 120' having a predetermined width and length, and in order to form the through-portion 120 or 120', the separation member 14 may press a cut-out piece cut from the sheet body M having the first area downward through the edge blade 12'.

Thus, the cut-out piece cut from the sheet body M having the first area through the edge blade 12" may be separated from the sheet body M having the first area through the separation member 14. In addition, the cut-out piece separated from the sheet body M having the first area may fall downward through the opening hole 22 or 22' of the lower mold 20 for primary punching.

For this reason, when the upper mold 10" for primary punching is used, the cut-out piece C can be easily removed in the primary punching process without the need to separate the cut-out piece cut from the sheet body M having the first area through the edge blade 12" in the process of forming the through-portions 120 or 120'.

Accordingly, when the upper mold 10" for primary punching is used, operations of removing unnecessary cut-out pieces generated in a process of forming the through-portions 120 or 120' and the cracks 130 inside the sheet body M and unnecessary cut-out pieces generated in a process of forming the through-portions 120 or 120' may be performed together.

As a result, when the upper mold 10" for primary punching is used, even when the shielding sheet 300 including the through-portions 120 or 120' and the cracks 130 is manufactured, an entire process can be simplified to reduce production costs.

Operation S3 of performing secondary punching of the sheet body having the first area may be an operation of forming the shielding sheet 300, which has the second area relatively less than the first area of the sheet body M, from the sheet body M having the first area.

That is, operation S3 of performing secondary punching of the sheet body having the first area may be an operation of processing the sheet body M having the first area to a size of the shielding sheet 300 which is the final product, may be an operation of forming the outer edge L of the shielding sheet 300 having the second area from the sheet body M having the first area, and may be an operation of processing the shielding sheet 300, which is the final product, to be separated from the sheet body M having the first area along the outer edge L.

In this case, the outer edge L may be formed from the sheet body M having the first area so as to include the through-portion 120 or 120' formed through the upper mold 10 for primary punching.

Figure 17:
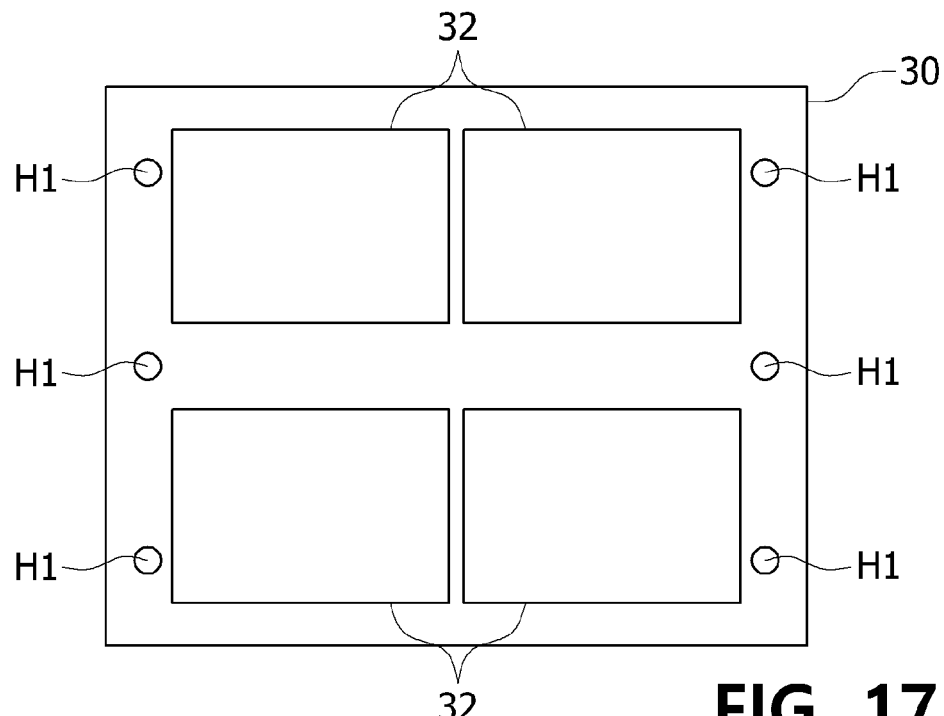
FIG. 17 is a plan view illustrating one type of a mold usable in a secondary punching operation in the manufacturing method of a magnetic field shielding sheet according to one embodiment of the present invention.

Specifically, operation S3 of performing secondary punching of the sheet body having the first area may be performed using a mold 30 for secondary molding shown in FIG. 17.

That is, the mold 30 for secondary punching may include one or more edge blades 32 formed to protrude to a predetermined height from one surface thereof, and the outer edge blade 32 may be formed in a hollow ring shape.

In addition, like the upper mold 10 for primary punching, the mold 30 for secondary punching may include first guide holes H1, through which the guide bars G pass, such that movement thereof may be guided through the guide bars G.

Accordingly, when the mold 30 for secondary punching is pressed against the sheet body M having the first area, in which the through-portions 120 or 120' and the cracks 130 induced therefrom are formed through the upper mold 10, 10', or 10" for primary punching, as shown in FIGS. 18A and 19A, the outer edge L, which surrounds the plurality of through-portions 120 or 120' and define the second area, may be formed in the seat body M having the first area through the outer edge blades 32.

Thus, when a portion having the second area defined through the outer edge L is separated from the sheet body M having the first area, the shielding sheet 300, which is the final product, may be manufactured from the sheet body M having the first area.

In this case, in operation S3 of performing secondary punching of the sheet body having the first area, as described above, the sheet body M having the first area may include one pair of protective films 113a and 113b respectively attached to the upper surface and the lower surface of the sheet body M through second adhesive layers 112a and 112b, the outer edge L formed through the mold 30 for secondary punching may be formed to pass through all of the sheet body M having the first area and the second adhesive layers 112a and 112b, and the outer edge L may not be formed in the protective film 113b attached to the lower surface of the sheet body M having the first area.

That is, as shown in FIG. 20, the outer edge L may be formed to pass through the sheet body M having the first area, the second adhesive layers 112a and 112b, and the protective film 113a attached to the upper surface of the sheet body M and to not pass through the protective film 113b attached to the lower surface of the sheet body M.

Accordingly, when a plurality of shielding sheets 300 having the second area are formed in one sheet body M having the first area through the manufacturing method of a magnetic field shielding sheet according to one embodiment of the present invention, the protective film 113b attached to the lower surface of the sheet body M having the first area may serve as a tray for maintaining a state in which the plurality of shielding sheets 300 having the second area are attached to one surface thereof.

In addition, when the shielding sheet 300 having the second area is individually separated from the sheet body M having the first area, the second adhesive layer 112b may be exposed to the outside at one surface of the shielding sheet 300 having the second area separated from the sheet body M having the first area.

For this reason, a user may individually separate the shielding sheet 300 having the second area from the sheet body M having the first area and then may use the second adhesive layer 112b exposed to the outside to attach the shielding sheet 300 to other components or to attach other components to the shielding sheet 300.

However, a forming method of the outer edge L is not limited thereto, and the outer edge L formed in operation S3 of performing secondary punching of the sheet body having the first area may be formed such that the shielding sheet 300 can be completely separated from the sheet body M having the first area.

That is, the outer edge L formed through the mold 30 for secondary punching may be formed to pass through all of the sheet body M having the first area, the second adhesive layers 112a and 112b, and one pair of the protective films 113a and 113b attached to the upper surface and the lower surface of the sheet body M having the first area.

Meanwhile, as described above, the through-portions 120 or 120' formed in operation S2 of performing primary punching of the sheet body having the first area may be partially formed only in a partial area of the total area of the shielding sheet 300 which is the final product.

Figure 18B:
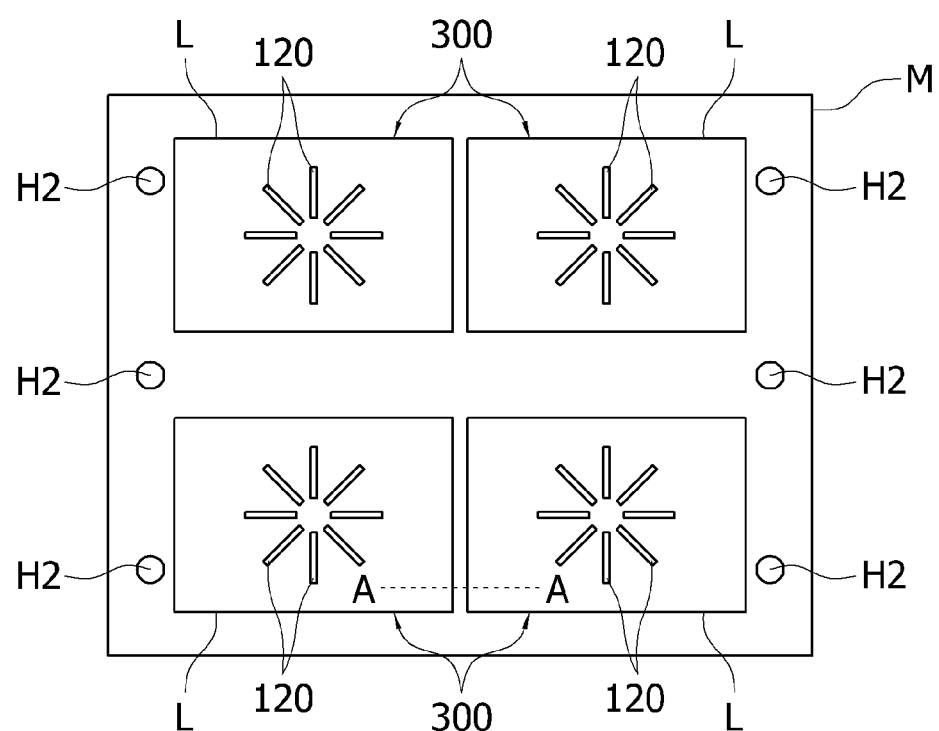
FIG. 18B is a plan view illustrating a multi-layered sheet in a state in which secondary punching on the multi-layered sheet of FIG. 18A is completed using the mold of FIG. 17.

As an example, as shown in FIG. 18B, the through-portions 120 may be formed in a partial area, in which a pattern portion P of an antenna 211 is disposed, of the total area of the shielding sheet 300 which is the final product, and the partial area in which the pattern portion P of the antenna 211 is disposed may be the arrangement region A1 as described above.

Thus, in the shielding sheet 300 separated from the sheet body M having the first area, the through-portions 120 and the cracks 130 induced from the through-portions 120 may be formed together only in a partial area, which corresponds to the pattern portion P of the antenna 2111, of the total area of the shielding sheet 300.

In this case, as described above, the through-portions 120 formed only in the partial area corresponding to the pattern portion P of the antenna 211 may be formed through various methods shown in FIGS. 2 to 4.

As another example, as shown in FIG. 19B, the through-portions 120' formed in operation S2 of performing primary punching of the sheet body having the first area may be formed only in a partial area, in which a magnetic flux is concentrated, of the total area of the shielding sheet 300 which is the final product. In addition, a partial region in which a magnetic flux is concentrated may be a corresponding region A2 corresponding to a hollow portion E of the antenna 211.

Thus, in the shielding sheet 300 separated from the sheet body M having the first area, the through-portions' 120 and the cracks 130 induced from the through-portions 120' may be formed together only in a partial area, which corresponds to the hollow portion E of the antenna 211, of the total area of the shielding sheet 300.

In this case, as described above, the through-portions 120' formed only in the partial area corresponding to the hollow portion E of the antenna 211 may be formed through various methods shown in FIGS. 6 to 8.

While the embodiments of the present invention have been described above, the present invention is not limited to the embodiment presented herein. One skilled in the art may easily suggest other embodiments due to addition, modification, deletion, and the like of components within the scope and spirit of the present invention, and the addition, modification, deletion, and the like of the components fall within the scope and spirit of the present invention.

The invention claimed is:

1. A manufacturing method of a magnetic field shielding sheet for an antenna that includes a hollow portion having a predetermined area in a central portion thereof and a pattern portion configured to surround the hollow portion, the manufacturing method comprising:

providing a sheet body having a first area formed as a ribbon sheet including at least one selected from an amorphous alloy and a nanocrystalline alloy which are treated with heat;

performing primary punching of the sheet body to form a plurality of through-portions having a predetermined width and length in an inner region of the sheet body and form a plurality of cracks extending from the plurality of through-portions; and performing secondary punching of the sheet body to form a shielding sheet which includes the plurality of through-portions and has a second area that is smaller than the first area, wherein, in the primary punching of the sheet body, the plurality of through-portions and the plurality of cracks are formed locally in a region of the sheet body corresponding to the pattern portion of the antenna among an entire area of the sheet body so that the entire area of the sheet body is not separated into a plurality of pieces.

2. The manufacturing method of claim 1, wherein the plurality of through-portions are formed to pass through the region of the sheet body corresponding to the pattern portion of the antenna.

3. The manufacturing method of claim 1, wherein the primary punching is performed using a mold which includes an edge blade having a rig shape configured to form an edge of the plurality of through-portions and a separation member formed in an inner region of the edge blade and configured to press a cut-out piece cut from the sheet body through the edge blade to separate the cut-out piece.

4. The manufacturing method of claim 1, wherein the secondary punching of the sheet body forms an outer edge defining the second area in the sheet body such that the shielding sheet is separable from the sheet body.

5. The manufacturing method of claim 4, wherein:

the providing of the sheet body includes forming a multi-layered sheet comprising a multi-layer stack of a plurality of ribbon sheets in which a first adhesive layer is applied between each of ribbon sheets to form the multi-layer stack of the plurality of ribbon sheets, and attaching a protective film to at least one surface of an upper surface and a lower surface of the multi-layered sheet by applying a second adhesive layer between the protective film and the upper surface and/or between the protective film and the lower surface; and the outer edge is formed to pass through the multi-layered sheet and the second adhesive layer.

6. The manufacturing method of claim 1, wherein a through-portion of the plurality of through-portions comprises a curved portion.

* * * * *